US009954493B2

(12) United States Patent
Seshita et al.

(10) Patent No.: US 9,954,493 B2
(45) Date of Patent: Apr. 24, 2018

(54) HIGH FREQUENCY SEMICONDUCTOR AMPLIFIER CIRCUIT

(71) Applicant: KABUSHIKI KAISHA TOSHIBA, Tokyo (JP)

(72) Inventors: Toshiki Seshita, Kawasaki Kanagawa (JP); Yasuhiko Kuriyama, Yokohama Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 15/460,879

(22) Filed: Mar. 16, 2017

(65) Prior Publication Data

US 2018/0062581 A1    Mar. 1, 2018

(30) Foreign Application Priority Data

Aug. 30, 2016    (JP) .................................. 2016-168465

(51) Int. Cl.
*H03F 3/04* (2006.01)
*H03F 1/22* (2006.01)
*H03F 3/195* (2006.01)

(52) U.S. Cl.
CPC ............. *H03F 1/223* (2013.01); *H03F 3/195* (2013.01); *H03F 2200/294* (2013.01); *H03F 2200/451* (2013.01); *H03F 2200/555* (2013.01)

(58) Field of Classification Search
CPC .................................................... H03F 3/04
USPC ........................................ 330/296, 285, 311
See application file for complete search history.

(56) References Cited

U.S. PATENT DOCUMENTS

| 6,392,490 B1 * | 5/2002 | Gramegna | G05F 3/205 |
| | | | 330/283 |
| 6,778,016 B2 * | 8/2004 | Luo | H03F 1/20 |
| | | | 330/288 |
| 6,965,270 B1 * | 11/2005 | Ross | H03F 1/223 |
| | | | 330/291 |
| 7,088,187 B1 * | 8/2006 | Jin | H03G 1/0029 |
| | | | 330/296 |

(Continued)

FOREIGN PATENT DOCUMENTS

| JP | 2006303850 A | 11/2006 |
| JP | 2008306360 A | 12/2008 |

(Continued)

*Primary Examiner* — Henry Choe
(74) *Attorney, Agent, or Firm* — Patterson & Sheridan, LLP

(57) ABSTRACT

A high-frequency semiconductor amplifier circuit includes a first transistor provided on a SOI (Silicon on Insulator) substrate having a grounded source, a second transistor provided on the SOI substrate and cascode-connected to the first transistor, and a bias generation circuit provided on the SOI substrate and generating a gate voltages for the first and second transistors, and a first voltage for a drain of the second transistor. The bias generation circuit sets the gate voltage of the first transistor to a voltage between a second voltage and a third voltage, wherein the gate voltage is smaller than a voltage between a drain-to-source voltage of the first transistor, and wherein the second voltage is a threshold voltage of the first transistor and the third voltage is a gate-to-source voltage at which a second derivative of a square root of the drain current with respect to the gate-to-source voltage becomes a maximum.

20 Claims, 29 Drawing Sheets

(56) References Cited

U.S. PATENT DOCUMENTS

| | | | |
|---|---|---|---|
| 7,397,309 B2* | 7/2008 | Tanoi | H03F 1/086 |
| | | | 330/296 |
| 7,629,853 B2 | 12/2009 | Oishi | |
| 7,911,279 B2* | 3/2011 | Chow | H03F 1/223 |
| | | | 330/296 |
| 9,438,175 B2 | 9/2016 | Onizuka | |

FOREIGN PATENT DOCUMENTS

| JP | 2009105810 A | 5/2009 |
|---|---|---|
| JP | 2015061294 A | 3/2015 |

* cited by examiner

FET1B is a replica FET of FET1A (similar to FET1A without Wg)
FET2B is a replica FET of FET2A (similar to FET2A without Wg)

FIG. 24

HIGH FREQUENCY SEMICONDUCTOR AMPLIFIER CIRCUIT

CROSS REFERENCE TO RELATED APPLICATION

This application is based upon and claims the benefit of priority from the prior Japanese Patent Application No. 2016-168465 filed on Aug. 30, 2016, the entire contents of which are incorporated herein by reference.

FIELD

Embodiments described herein relate generally to a high frequency semiconductor amplifier circuit.

BACKGROUND

Recently, a high frequency low noise amplifier formed by a SOI (Silicon On Insulator) CMOS process (hereinafter SOI process) in place of a SiGe bipolar process (hereinafter SiGe process) has been considered. A MOS transistor formed by the SOI process can be provided at a lower cost and has a smaller parasitic capacitance than that formed by the SiGe process, and thereby, an electric power loss of a high frequency signal can be reduced. Both the high frequency low noise amplifier and a high frequency switch can be provided on a same substrate by using the SOI process without deteriorating electrical characteristics.

However, it is not easy to provide a high frequency low noise amplifier formed by the SOI process that is similar in electrical characteristics (especially, noise figure NF) to the high frequency low noise amplifier formed by the SiGe process.

BRIEF DESCRIPTION OF THE DRAWINGS

FIG. 24 is a diagram summarizing data from the first to the fourth embodiments.

DETAILED DESCRIPTION

Embodiments provide a high frequency semiconductor amplifier circuit excellent in electrical characteristics such as noise figure and others.

According to a present embodiment, a high frequency semiconductor amplifier circuit includes a first transistor provided on a SOI (Silicon on Insulator) substrate and having a source which is grounded, a second transistor provided on the SOI substrate and cascode-connected to the first transistor, and a bias generation circuit provided on the SOI substrate and configured to generate a gate voltage of the first transistor, a gate voltage of the second transistor, and a first voltage of a drain of the second transistor. The bias generation circuit is configured to set the gate voltage of the first transistor to a voltage between a second voltage and a third voltage, wherein the gate voltage is smaller than a voltage between a drain and a source of the first transistor, and wherein the second voltage is a threshold voltage of the first transistor, and the third voltage is a gate-to-source voltage at which a second derivative of a square root of the drain current with respect to the gate-to-source voltage becomes a maximum.

An embodiment of a present invention will be described hereinafter with reference to the accompanying drawings. Prior to a description of a specific embodiment, electrical characteristics of MOS transistors formed by a SiGe process or a SOI process will be described.

A transconductance value Gm is used as an index directly related to the noise figure NF and a gain of a transistor. The value Gm/Idd of a bipolar transistor is constant regardless of an operating point, where Idd is a consumption current. In general, Gm/Idd value of a MOSFET is smaller than that of a transistor formed by the SiGe process and can be changed widely in reference to a gate voltage.

Gm of the bipolar transistor is expressed by a following expression.

$$Gm = (kT/q)Idd \quad (1)$$

Where, k is a Boltzmann constant, T is an absolute temperature, and q is an elementary charge.

On the other hand, Gm in a saturated region applied with an ideal MOSFET model (LEVEL 1) is expressed by a following expression.

$$Gm = \sqrt{(2Idd \cdot \mu \cdot Cox \cdot Wg/Lg)} \quad (2)$$

Where, μ is an electron mobility, Cox is a gate capacitance, and Lg is a gate length.

As indicated by the expression (2), the desired Gm value of the MOSFET is obtained by optimizing both element constants such as the gate capacitance, the gate width, and the gate length, and bias conditions such as a voltage Vgs between a gate and a source, and a voltage Vds between a drain and a source. In the present embodiment, the element constants and the bias conditions are optimized.

A First Embodiment

Figure 1:
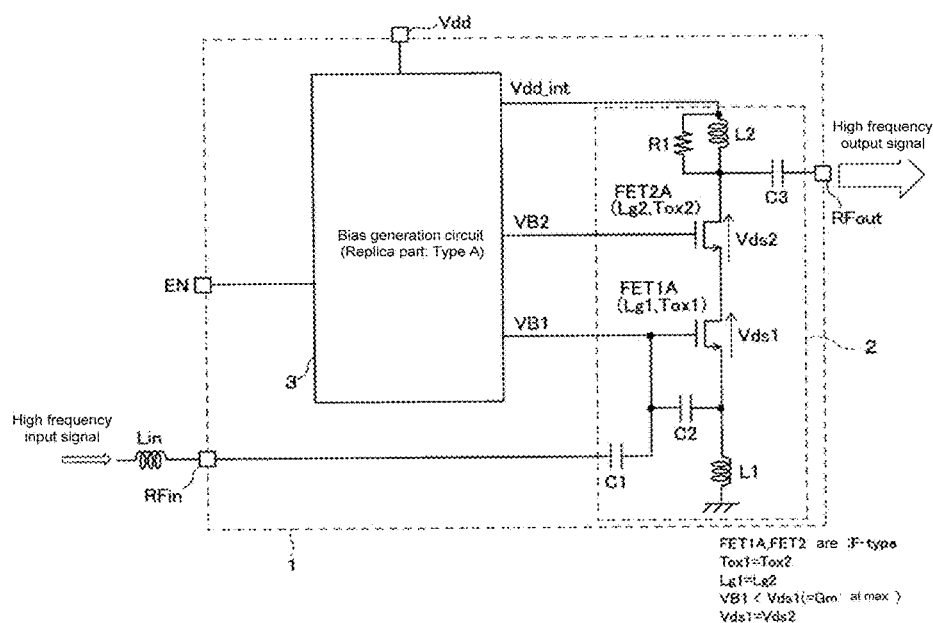
FIG. 1 is a block diagram of a high frequency module according to a first embodiment.

FIG. 1 is a block diagram of a high frequency semiconductor amplifier circuit 1 according to a first embodiment, which is also called as a high frequency LNA (low noise amplifier) 1. The high frequency LNA1 is formed by a CMOS process and includes a cascode amplifier circuit 2 and a bias generation circuit 3 on a common SOI substrate.

The cascode amplifier circuit 2 includes a n-type transistor FET1A (a first transistor), a n-type transistor FET2A (a second transistor), inductors L1, L2, a resistor R1, and capacitors C1, C2, C3. FET1A and FET2A are cascode-connected.

Herein, in embodiments, a n-type or p-type MOS transistor which is referred to as FET, NMOS, or PMOS and so on, is formed by CMOS process, and their configurations are essentially similar to each other with a small difference in the gate length and a thickness of a gate oxide film.

The gate of FET1A is connected to an input terminal RFin to which a high frequency input signal is input through the capacitor C1 and an inductor Lin provided outside of the high frequency semiconductor amplifier circuit 1. The capacitor C1 is provided for blocking a direct current component. The gate of FET1A receives a bias voltage VB1 which is generated by the bias generation circuit 3. A source of FET1A is connected to a signal ground by a source degeneration inductor L1.

The gate of FET2A receives a bias voltage VB2 which is generated by the bias generation circuit 3. The source of FET2A is connected to the drain of FET1A. The drain of FET2A is supplied with an internal voltage Vdd_int from the bias generation circuit 3 though the resistor R1 and the inductor L2 connected in parallel to each other. The inductor L2 and the capacitor C3 are provided to adjust a characteristic impedance at an output terminal RFout.

The bias generation circuit 3 includes a terminal for receiving an enable signal EN and a terminal for receiving an external power supply voltage Vdd. The bias generation circuit 3 generates the bias voltage VB1, VB2, and the internal voltage Vdd_int when the bias generation circuit 3 receives the external power supply voltage Vdd and a high level of the enable signal, for example.

The cascode amplifier circuit 2 and the bias generation circuit 3 in the high frequency LNA1 shown in FIG. 1 are formed on the common SOI substrate and integrated into one chip. The inductor Lin, which is provided outside of this chip, the capacitor C2, and the inductor L1 are arranged for an input matching and a noise matching.

Important figures of merit for the high frequency LNA1 are the gain and the noise figure NF. In general, the gain and the noise figure NF are improved as the bias current Idd is increased. Also, NF is decreased as the gain is increased. With respect to the gain, the gain/Idd is required to be large, and thereby, NF/Idd can become satisfactory.

Figure 2:
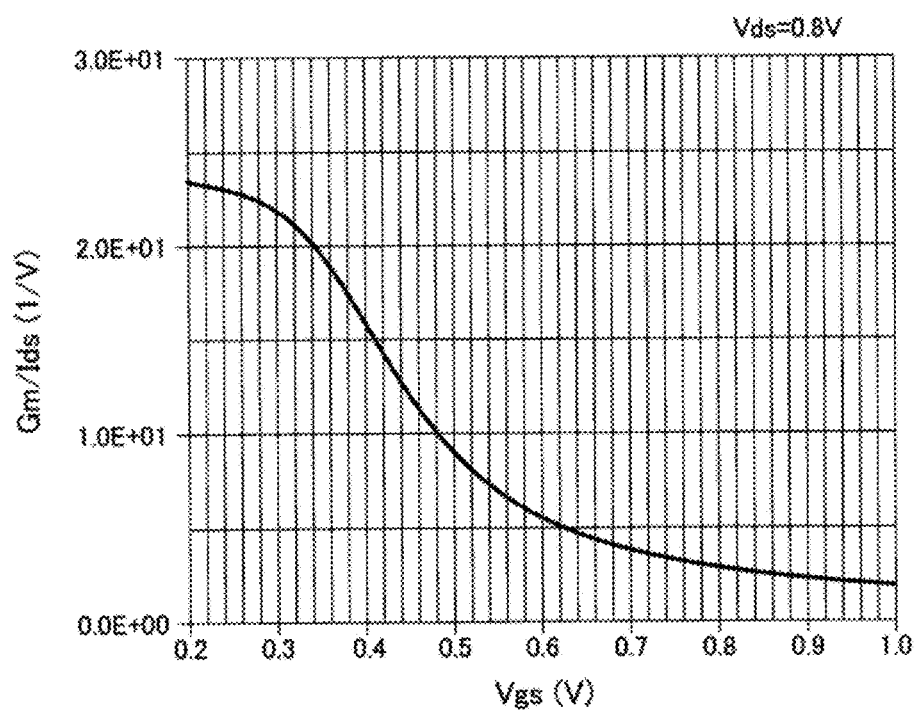
FIG. 2 is a graph showing Gm/Idd versus Vgs characteristics for an ideal MOSFET model (LEVEL 1).

FIG. 2 is Gm/Ids characteristic versus Vgs in an ideal MOSFET model (LEVEL 1). Gm is a parameter which affects the gain directly. For higher gain/Ids, it is better that the Vgs value be small. However, in FIG. 2, a sub-threshold characteristic is not considered, therefore, an operation of an actual MOSFET is close to an operation in class B and a linearity thereof deteriorates.

Furthermore, controlling the current by the bias circuit is difficult, specifically, variation of the current can be large, because Idd is an exponential function of Vgs in a sub-threshold region and can be changed by a large amount in response to a small variation of VB1.

Therefore, it is desirable that Vgs is higher than Vth but set as low as possible.

Figure 3:
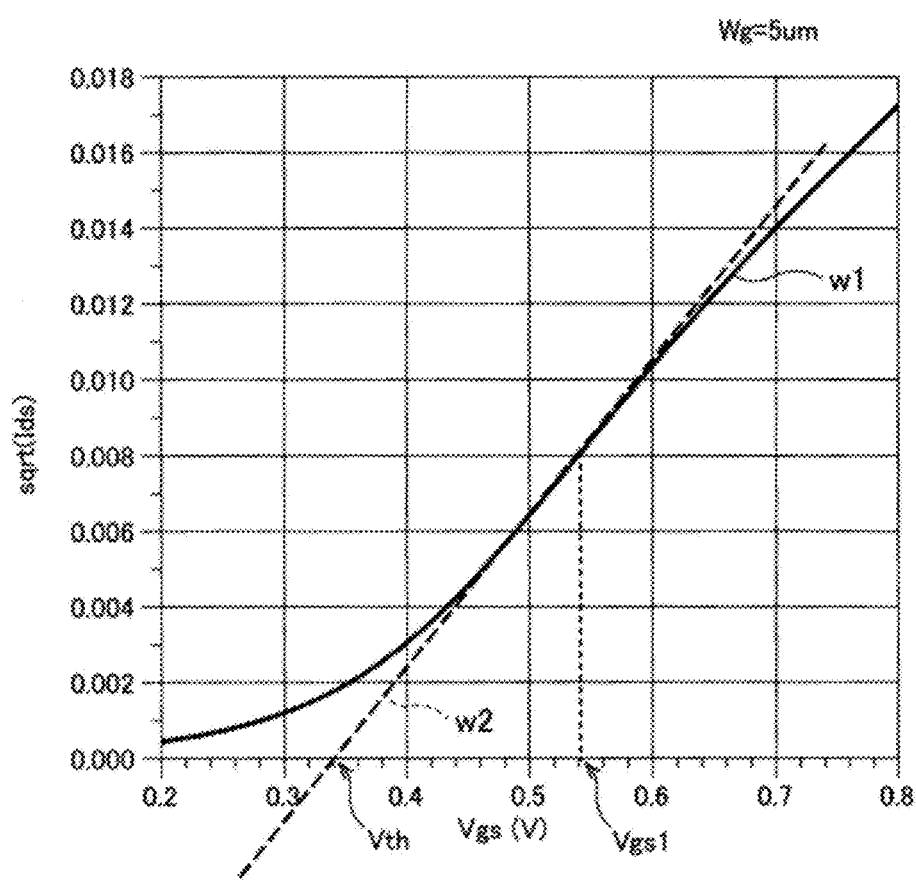
FIG. 3 is a graph showing sqrt(Ids) versus Vgs in FET1A.

First, a definition of Vth will be described. FIG. 3 shows sqrt(Ids) versus Vgs characteristics in FET1A. As depicted in FIG. 3, Vgs1 indicates a Vgs value whose first derivative of sqrt(Ids) with respect to Vgs is a maximum. An x-axis intercept in a tangent line in Vgs1 is referred to as Vth. As shown in FIG. 3, Vth is equal to about 0.34V. The gate voltage VB1 in FET1A should be set to be larger than the threshold voltage, and it is desirable that the gate voltage VB1 is smaller than Vgs in a region where a variation in values of square root of the drain current Ids becomes linear, because Gm/Ids is low in the region.

Figure 4:
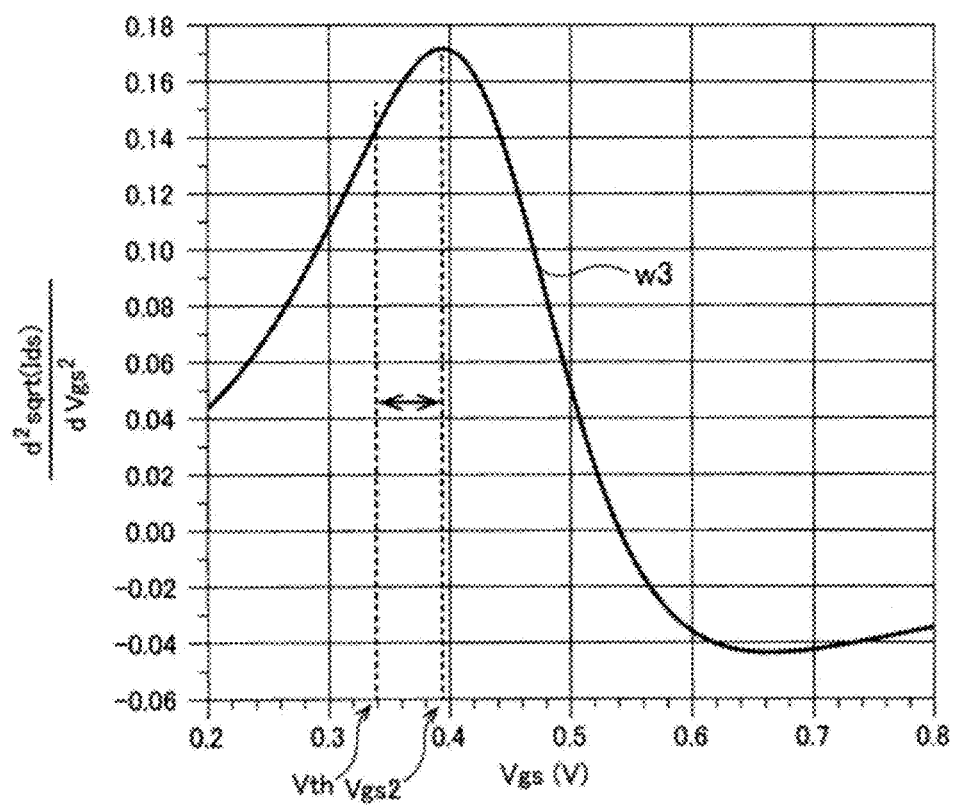
FIG. 4 is a graph showing a second order derivative of the function sqrt(Ids) versus Vgs.

FIG. 4 shows a second derivative of sqrt(Ids) with respect to Vgs. The figure indicates that the value of Vgs at which the second derivative is a maximum is Vgs2 (approximately 0.4 V).

First, an inequality Vth<VB1<Vgs2 can be set in the embodiment. Thereby, the high frequency LNA1 with a low current consumption can obtain a high gain and a low NF. Also, it has a superior linearity and a small bias current variation.

Second, a requirement in a voltage Vds1 between the drain and the source in FET1A is set. In general, it is desirable that the MOSFET on the bulk silicon have a highest voltage Vds within a predetermined power supply voltage and a predetermined breakdown voltage of an element. However, the voltage Vds in the MOS transistor on the SOI is not similar to that of the bulk silicon. It is described as below.

Figure 5A:
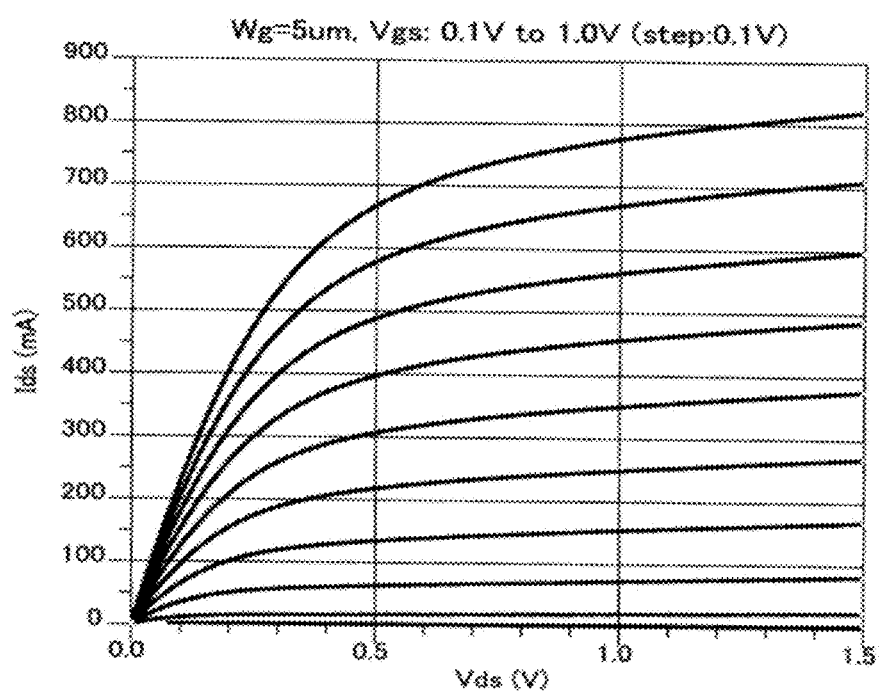
FIG. 5A is a graph showing an example of Ids versus Vds characteristics of a normal bulk silicon.
Figure 5B:
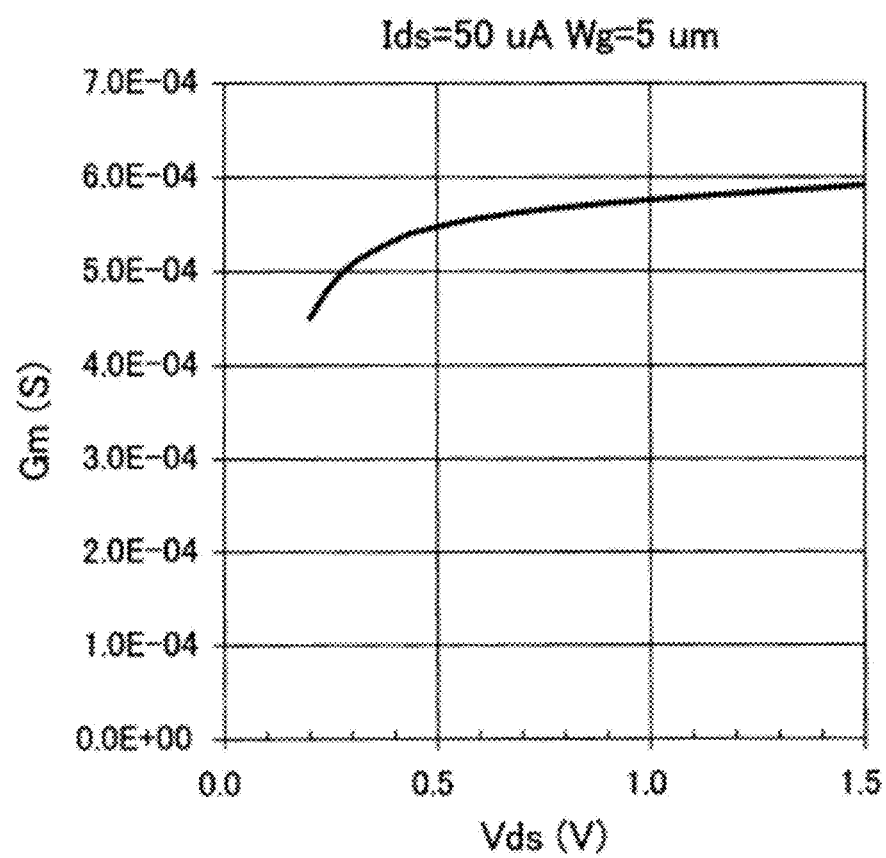
FIG. 5B is a graph showing Gm versus Vds characteristics under a fixed condition of Ids (50 μA).

A direct current characteristic in NMOS transistor on the bulk silicon is described at first. FIG. 5A is a graph showing an example of Ids-Vds characteristics in a general bulk silicon. FIG. 5A represents general characteristics having a linear region and a saturation region. FIG. 5B is a graph showing Gm-Vds characteristics under a fixed condition of Ids (50 µA) in the same NMOS transistor as FIG. 5A. If a drain conductance Gd in the saturation region is zero, Gm in the saturation region is constant. However, as is evident from FIG. 5A, Gd takes a finite value. Therefore, Gm has a small Vds dependency and becomes large as Vds becomes large.

Figure 6A:
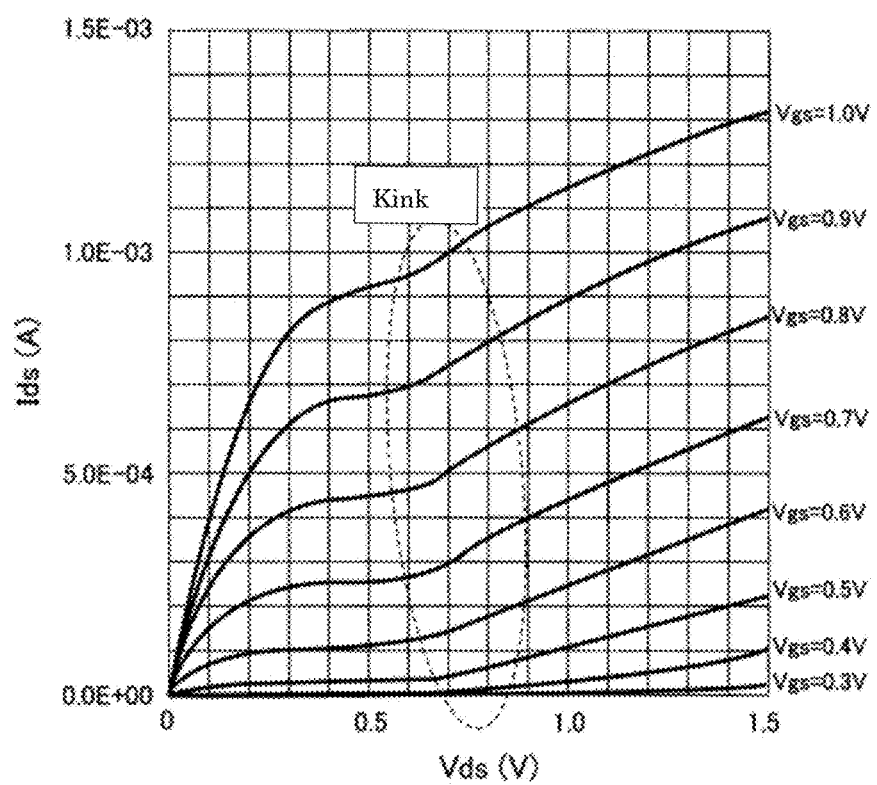
FIG. 6A is a graph showing an example of Ids versus Vds characteristics for an NMOS transistor on SOI.

Next, the characteristics in NMOS transistor on the SOI are described. FIG. 6A is a graph showing an example of Ids-Vds characteristics in NMOS transistor on the SOI. Herein, a gate oxide film thickness is set to be 2.5 nm (nanometers), a gate length is set to be 0.14 µm (micrometers), and a gate width is set to be 5 µm. As depicted in FIG. 6A, a kink, where the drain current Ids is increases rapidly, occurs. The occurrence of the kink is derived from a floating body effect, that is, holes generated as hot carriers by an impact ionization are accumulated in the body region, herein, the impact ionization is caused by electrons with a high energy due to a strong electric field around the drain.

Figure 6B:
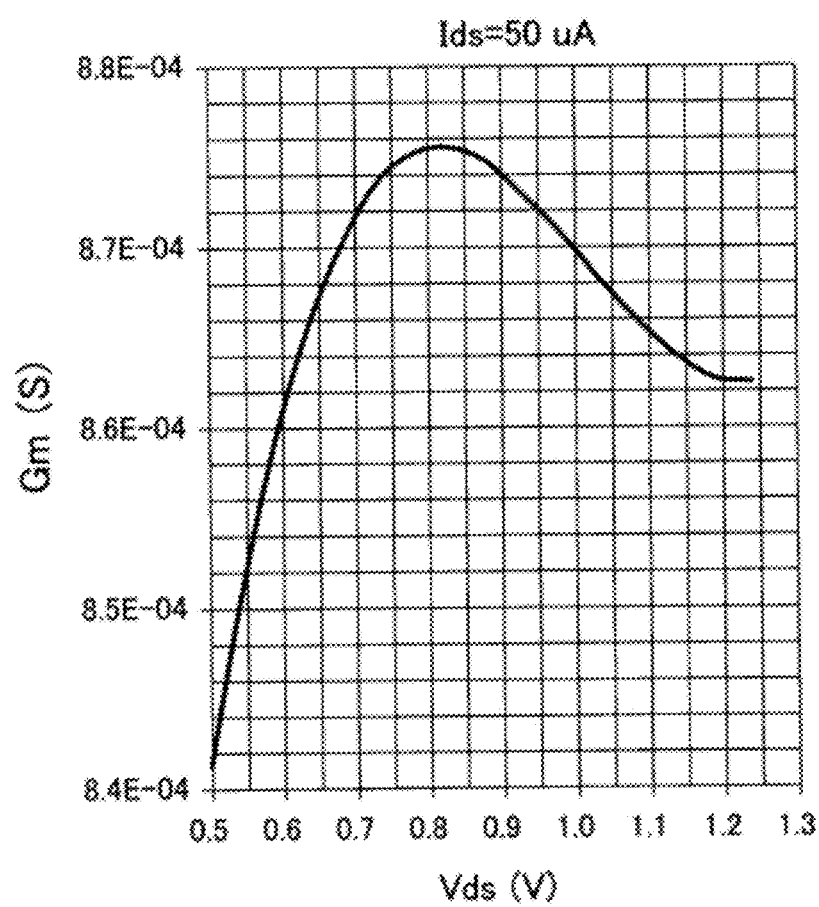
FIG. 6B is a graph showing an example of Gm versus Vds characteristics of the same NMOS transistor as FIG. 5A

FIG. 6B is a graph showing an example of Gm-Vds characteristics in the same NMOS transistor as FIG. 6A. Herein, Ids is set to be constant (50 µA). In FIG. 6B, the Gm-Vds characteristic is very different from FIG. 5B, as Gm has a peak value about Vds=0.8 V. This peak has a significant meaning from the point of view of the noise figure NF, that is, the noise figure NF deteriorates by an occurrence of the hot carriers.

As described above, it is clear that the peak characteristic of Gm depicted in FIG. 6B is derived from the occurrence of the hot carriers. Also, it can be considered that Vds value where Gm takes a maximum value determines a boundary at which occurrence of hot carriers.

Figure 7:
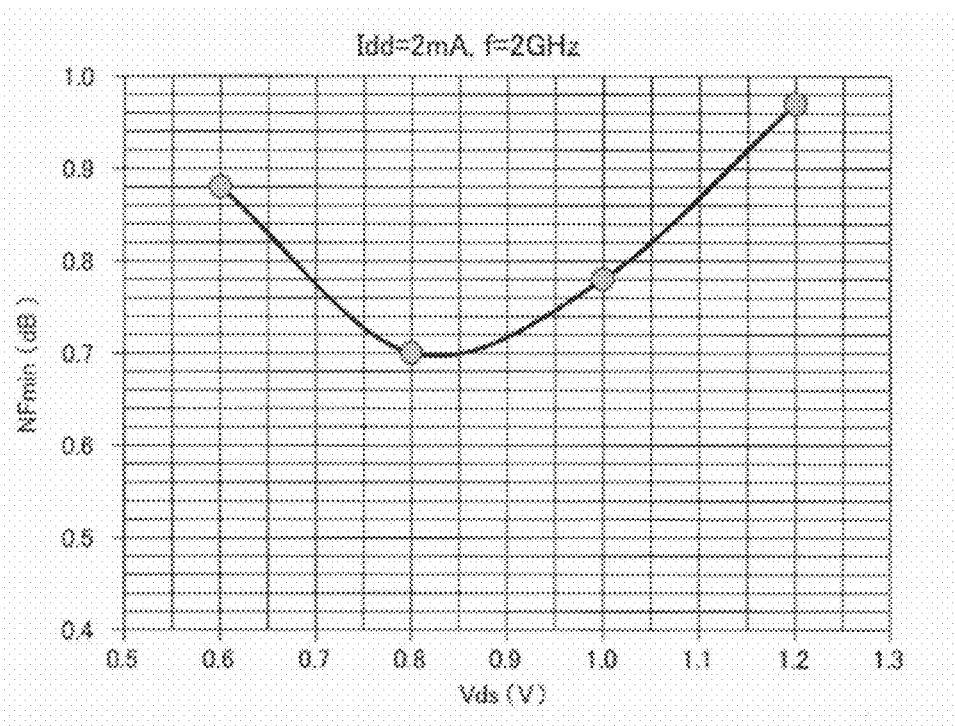
FIG. 7 is a graph showing a minimum value of a noise figure of a source-grounded MOS transistor with respect to a voltage between a drain and the source thereof

FIG. 7 is a graph showing a minimum noise figure NFmin of a source-grounded MOS transistor against the voltage Vds1 between a drain and the source thereof. Herein, NFmin represents a noise figure NF value in case of a noise matching. The gate width Wg in MOS transistor in FIG. 7 is set to be 2 mm (millimeters) which is forty times of a gate width Wg in FIG. 5B, and Ids is set to be 2 mA (milliamps). That is, the drain current per unit of a gate width is same as that of FIG. 5B.

As depicted in FIG. 7, the minimum noise figure NFmin has a minimum value when the voltage Vds1 between the source and the drain is about 0.8V. Vgs has a value of 0.346V when Vds1 has a value of 0.8V.

As described above, the noise figure NF can be minimized by setting Vds1 so that Gm takes a maximum value in a predetermined current consumption.

The above description is for a bias point in the source-grounded FET1A in the cascode amplifier circuit 2 which is a major body of the high frequency LNA1. In this embodiment, a bias generation circuit 3 is set forth to realize the above requirements. Hereinafter, a circuit configuration of the bias generation circuit 3 is described.

Figure 8:
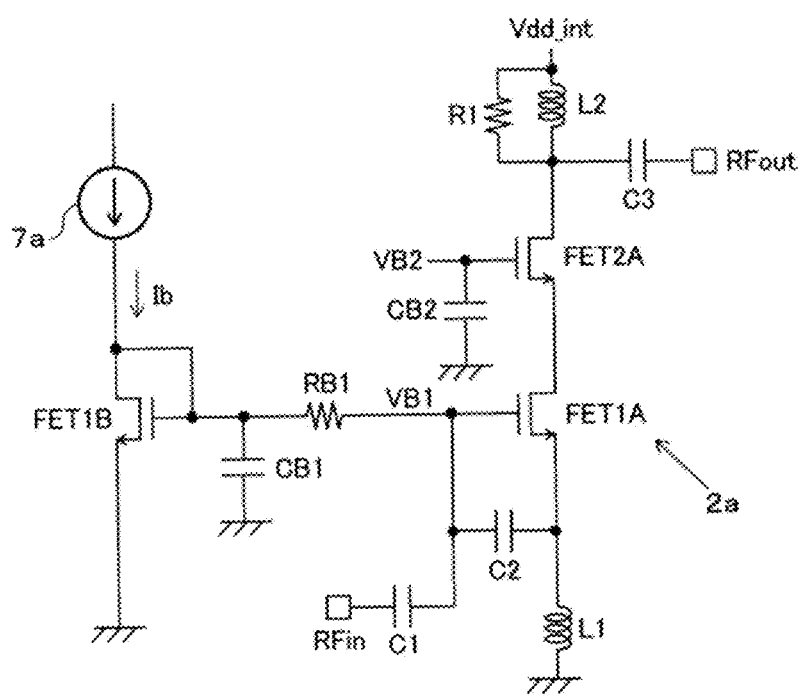
FIG. 8 is a circuit diagram of a cascode amplifier circuit and a bias generation circuit according to one comparative example.

At first, a comparative example of a bias generation circuit 3a is described. FIG. 8 is a circuit diagram of a cascode amplifier circuit 2a and the bias generation circuit 3a according to one comparative example. In FIG. 8, the bias generation circuit 3a includes a current mirror circuit which includes FET1A and FET1B which is a replica FET of FET1A. FET1B is different from FET1A only in gate width Wg, and Wg of FET1A is set to be K times of Wg of FET1B (for example, K is equal to 100). The drain current in FET1B is a current Ib supplied from a current source 7a. The drain current in FET1A is thus K·Ib. Therefore, the bias current in the cascode amplifier circuit 2a can be set by only an adjustment of K.

However, drain conductance of FET1A and FET1B should be sufficiently small for operation of the above current mirror circuit.

In the embodiment, to realize the high gain and the low NF, it is assumed that a micro-fabrication MOSFET is used for FET1A and FET1B. A drain conductance in the micro-fabrication MOSFET is generally large, that is, the drain current in FET1A and FET1B are different from each other corresponding to the difference between Vds thereof while Vgs has the same value for each FET.

In FIG. 8, Vds in FET1A and FET1B in the current mirror circuit may not be exactly equal, therefore, a ratio of the current thereof cannot be 1:K. That is, the bias current Idd of the cascode amplifier circuit cannot be set based on K. The bias current Idd, which is a significant parameter, should be set accurately.

Also, as described above, Vds in FET1B in the current mirror circuit in FIG. 8 cannot be set to be a desirable value (for example, 0.8 V) at which Gm becomes a maximum value.

Furthermore, it is difficult to realize the inequality Vth<VB1<Vgs2, because, Vgs in FET1A may not be set between Vth and Vgs2 when Vgs in FET1B is set between Vth and Vgs2 because the characteristics depicted in FIG. 3 and FIG. 4 can depend on Vds.

Figure 9:
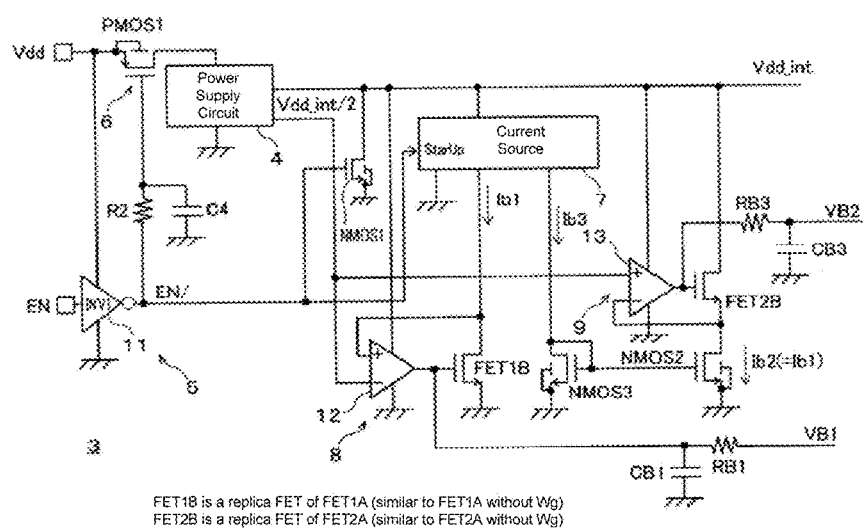
FIG. 9 is a circuit diagram showing an example of an internal configuration of the bias generation circuit in FIG. 1.
Figure 10:
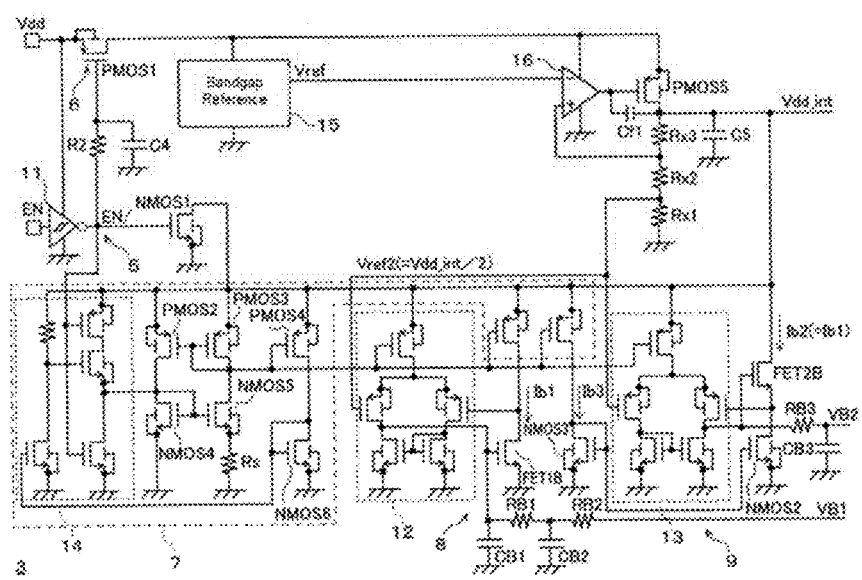
FIG. 10 is a circuit diagram showing a specific example of the bias generation circuit in FIG. 9

In the first embodiment, the bias generation circuit 3 in FIG. 9 and FIG. 10 is depicted. The bias generation circuit 3 in which Vds of FET1A and FET1B are equal, can achieve an ideal current mirror and Idd thereof can be set accurately. Thereby, the inequality Vth<VB1<Vgs2 can be achieved. Also, Vds in FET1B in the current mirror circuit can be set to be a desirable value at which Gm becomes a maximum value, because Vds in FET1A is set to be Vdd_int/2.

Hereinafter, the bias generation circuit 3 is described specifically. FIG. 9 is a circuit diagram showing an example of an internal configuration of the bias generation circuit 3 in FIG. 1. The bias generation circuit 3 includes a power supply circuit 4, an enable controlling circuit 5, a soft start circuit 6, a current source 7, a first replica circuit 8, and a second replica circuit 9.

The power supply circuit 4 generates two values of the internal voltages Vdd_int, Vdd_int/2. The internal voltage Vdd_int/2 has a half level of the internal voltage Vdd_int.

The enable controlling circuit 5 includes an inverter 11 and a n-type transistor NMOS1. The inverter 11 outputs low when an enable signal EN is set to be high, and NMOS1 is on off-state. That is, NMOS1 is on on-state when the enable signal EN is set to be low. An output voltage in the bias generation circuit 3 becomes a ground voltage (0V) when NMOS1 is on on-state, and becomes the internal voltage Vdd_int generated in the power supply circuit 4 when the NMOS1 is on off-state.

The soft start circuit 6 includes a p-type transistor (a fifth transistor) PMOS1, a resistor R2, and a capacitor C4. An each end of the resistor R2 and the capacitor C4 is connected to a gate of PMOS1. The other end of the resistor R2 is connected to an output node of the inverter 11 inside of the enable controlling circuit 5. The other end of the capacitor C4 is grounded. A source of PMOS1 receives the external power supply voltage Vdd, and a drain thereof is connected to a power supply voltage node in the power supply circuit 4. When the enable signal EN changes from low to high, PMOS1 becomes on-state rapidly, thereby, the drain-source voltage Vds1 and Vds2 of FET1A and FET2A become large temporarily. In response, the gate of PMOS1 in the soft start circuit 6 is connected to the resistor 2 and the capacitor C4, thereby, a falling waveform of the enable signal EN/ is slowed. The soft start circuit 6 can suppress a rapid increase of the drain-source voltage Vds1 and Vds2 of FET1A and FET2A during a transient response period just after the enable signal EN becomes an enable state.

The current source 7 generates a current Ib1 which is supplied to the first replica circuit 8 and a current Ib3 which is supplied to the second replica circuit 9 by using the internal voltage Vdd_int which is generated in the power supply circuit 4, when the enable signal EN in set to be high. The current Ib3 is folded back at the current mirror circuit inside the second replica circuit 9 and supplied to FET2B as a current Ib2. The generation of the current Ib1 and Ib3 in the current source 7 is blocked when the enable signal EN is set to be low.

The first replica circuit 8 includes a n-type transistor FET1B (a third transistor) which forms a current mirror circuit with FET1A, a first differential amplifier circuit 12, a capacitor CB1, and a resistor RB1. A drain of FET1B is supplied with the current Ib1 from the current source 7. A source of FET1B is grounded. A gate of FET1B is connected to the output of the first differential amplifier circuit 12. The positive input terminal in the first differential amplifier circuit 12 receives the drain voltage of FET1B and a negative input terminal receives the internal voltage Vdd_int/2. The first differential amplifier circuit 12 performs a negative feedback control so that the drain voltage of FET1B becomes the internal voltage Vdd_int/2. The output voltage of the first differential amplifier circuit 12 is supplied to the gate of FET1B and also supplied to the gate of FET1A through the resistor RB1 as a bias voltage VB1. The body of FET1B is in the same floating state as FET1A.

The second replica circuit 9 includes a n-type transistor FET2B (a fourth transistor) which forms a current mirror circuit with FET2A, a second differential amplifier circuit 13, a n-type transistor NMOS2 which is cascode-connected to FET2B, and a n-type transistor NMOS3 which forms a current mirror circuit with NMOS2. The body of FET2B is in the same floating state as FET2A.

The drain of FET2B is supplied with the internal voltage Vdd_int (a first voltage) and the source of FET2B is connected to a drain of NMOS2 whose source is grounded. The drain of NMOS3 is supplied with the current Ib3 from the current source 7. The drain of NMOS2, which forms a current mirror circuit with NMOS3, is supplied with the current Ib2. Also, the drain of FET2B, which is cascode-connected to NMOS2, has the current Ib2.

A positive input terminal in the second differential amplifier circuit 13 receives the internal voltage Vdd_int/2 (a second voltage), and the negative input terminal receives a source voltage of FET2B. The second differential amplifier circuit 13 performs a negative feedback control so that the source voltage of FET2B becomes the internal voltage Vdd_int/2. An output voltage of the second differential amplifier circuit 13 is supplied to the gate of FET2B and also supplied to the gate of FET2A through the resistor RB3 as a bias voltage VB2.

The resistors RB1 and RB3 and the capacitors CB1 and CB3 are provided for filtering out any high frequency signal in the bias generation circuit 3.

The current Ib1 is set to be the same as the current Ib2, that is, to be Ib1=Ib2=Ib. A drain-source voltages of FET1B and FET2B become Vdd_int/2 and the drain currents become Ib as described above.

By use of the current mirror circuits with FET1A and FET1B, and also with FET2A and FET2B, an expression (3) is established as follows.

$$\text{A gate width of } FET1B/\text{a gate width of } FET1A = \text{a gate width of } FET2B/\text{a gate width of } FET2A \quad (3)$$

As described above, the drain voltage of FET1B is set to be Vdd_int/2, therefore, the drain-source voltage Vds1 of FET1A is set to be Vdd_int/2. The drain voltage of FET1B, which is set to Vdd_int/2, is larger than the gate voltage of FET1A. Also, the drain voltage of FET2B is set to be Vdd_int/2, therefore, the drain-source voltage of FET2A is provided as follows, Vds2=Vdd_int−Vdd_int/2=Vdd_int/2. Expression (4) is derived from these relations.

$$Vds1=Vds2 \quad (4)$$

FIG. 10 is a circuit diagram showing a specific example of the bias generation circuit 3 in FIG. 9. The current source 7 includes a startup circuit 14, a pair of p-type transistors PMOS2 and PMOS3, a pair of n-type transistors NMOS4 and NMOS5, a resistor Rs, a p-type transistor PMOS4, and a n-type transistor NMOS 6.

The drain of NMOS 4 is connected to the drain of PMOS 2, and the drain of NMOS 5 is connected to the drain of PMOS3. The resistor Rs is connected between a source of NMOS5 and a ground node. The drains of PMOS3 and NMOS5 are connected to the gate of PMOS4. The drain and the gate of NMOS6 are connected to each other to form a diode-connected transistor.

The startup circuit 14 outputs a high voltage (the internal voltage Vdd_int) when the enable signal EN is set to be high. Thereby, NMOS4 and NMOS5 turn on and a voltage in the node between the drain of PMOS3 and the drain of NMOS5 is decreased. The current Ib1 and Ib3 are supplied to FET1B and NMOS3, respectively.

A value of the resistor Rs is set so that NMOS4 and NMOS5 biased in the sub-threshold region. The sub-threshold region means that the gate voltage is set to be equal to or less than, or around a threshold voltage, or that a channel region is in a weak inversion-state. In this case, the drain current Ibias of PMOS3 is given approximately by expression (5) as follows.

$$Ibias=(kT/q)\ln n/Rs \quad (5)$$

Where, k is a Boltzmann constant, q is an elementary charge, T is an absolute temperature, ln is a natural logarithm, and n is, for example, set to be 4.

The power supply circuit 4 in FIG. 10 includes a band gap reference circuit 15, a third differential amplifier circuit 16, a p-type transistor PMOS5, resistors Rx1, Rx2, and Rx3, and capacitors Cf1 and C5. A source of PMOS5 is connected to the drain of PMOS1 and the resistors Rx1, Rx2, and Rx3 are connected in series between a drain of PMOS5 and the ground node, where the drain of PMOS5 is set to be the internal voltage Vdd_int. The capacitor C5 is connected between the drain of PMOS5 and the ground node as an output earth capacitance. The capacitor Cf1 is connected between an output node in the third differential amplifier circuit 16 and the drain of PMOS5 as a stabilizing capacitor.

A positive input terminal in the third differential amplifier circuit 16 receives a voltage which is the internal voltage Vdd_int is divided by the resistors Rx1, Rx2, and Rx3. A negative input terminal in the third differential amplifier circuit 16 receives a reference voltage which is generated in the band gap reference circuit 15. Thereby, the third differential amplifier circuit 16 performs a negative feedback control of the internal voltage Vdd_int so that an expression (6) is established.

$$Vdd\_int=Vref\cdot(Rx1+Rx2+Rx3)/(Rx1+Rx2) \quad (6)$$

The internal voltage Vdd_int is set to be, for example, 1.6 V.

In this embodiment, an expression Rx1=Rx2+Rx3 is established, and a voltage in the connection point between Rx1 and Rx2 becomes Vdd_int/2.

The bodies of FET1A, FET1B, FET2A, and FET2B are electrically in a floating state. Hereinafter, a MOS transistor of which a body is in the floating state is called as F-type. Bodies of the MOS transistors other than FET1A, FET1B, FET2A, and FET2B are connected to sources thereof. Hereinafter, the MOS transistor in which the body is connected to the source thereof is called as B-S connection-type.

Gate oxide film thicknesses Tox of FET1A, 1B, 2A, and 2B are set to be equal, and gate lengths Lg are also set to be equal. Gate oxide film thickness Tox and gate length Lg are set to be limit values in a manufacturing process, for example, Tox=2.5 nm and Lg=0.14 μm.

As described above, micro-fabrication MOSFETs are used for FET1A, FET1B, FET2A, and FET2B to realize a favorable noise figure NF. On the other hand, the gate oxide film thickness Tox_dc of the other MOS transistors other than FET1A, FET1B, FET2A, and FET2B are all equal, and the gate lengths Lg_p of PMOS transistors of the other MOS transistors are all equal, and the gate lengths Lg_n of NMOS transistors of the other MOS transistors are all equal, for example, Tox_dc=9 nm, Lg_p=0.35 nm, and Lg_n=1 μm.

Thus, the gate oxide film thickness and the gate length of the other MOS transistors other than FET1A, FET1B, FET2A, and FET2B are set to be larger than those of FET1A, FET1B, FET2A, and FET2B, and B-S connection-type MOS transistors are used for the other transistors, thereby, maximum allowable voltages in the voltage Vgs between the gate and the source and in the voltage Vds between the drain and the source become large. For example, a maximum allowable voltage in the power supply voltage Vdd can be set to be 3.5V.

The gate oxide film thicknesses Tox and the gate lengths Lg in FET1A, FET1B, FET2A, and FET2B are set to be minimum values in the manufacturing process, in addition, it is necessary to supply an appropriate bias voltage so as to realize the favorable noise figure NF.

Figure 11A:
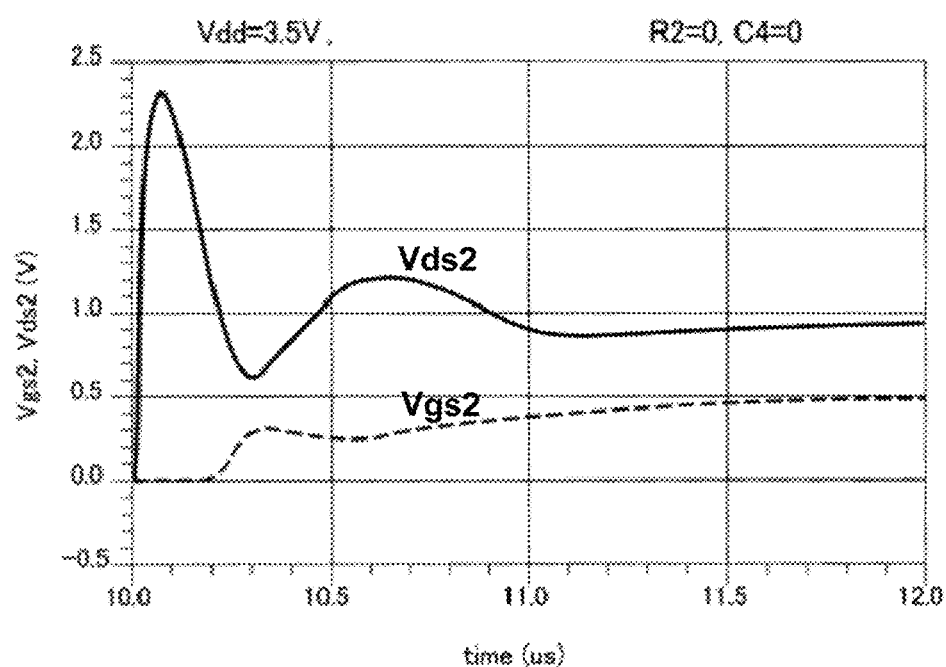
FIG. 11A is a voltage waveform diagram of Vgs2 and Vds2 of FET2A in case of the bias generation circuit that include a soft start circuit without a resistor and a capacitor.
Figure 11B:
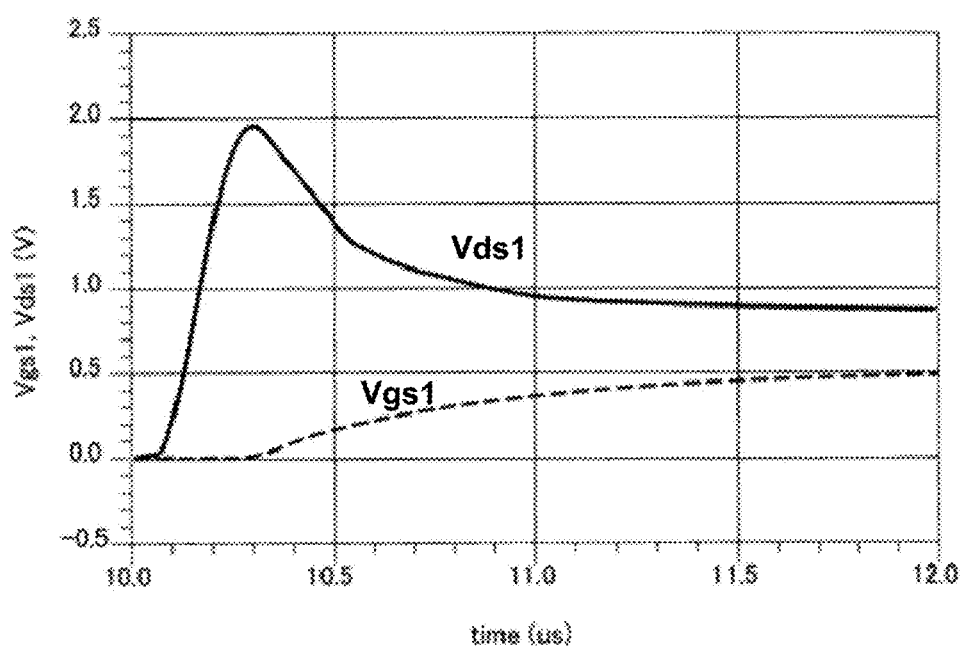
FIG. 11B is a voltage waveform diagram of Vgs1 and Vds1 of FET1A in case of the bias generation circuit that include a soft start circuit without a resistor and a capacitor.
Figure 11C:
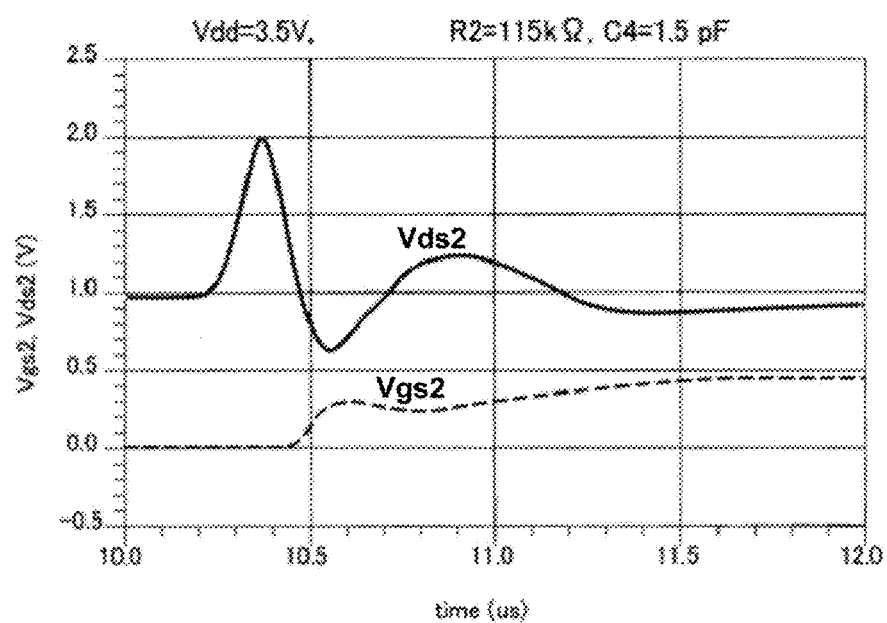
FIG. 11C is a voltage waveform diagram of a voltage between a gate and a source Vgs2 and a voltage between a drain and a source Vds2 of FET2A in case of the bias generation circuit that include a soft start circuit with a resistor and a capacitor.
Figure 11D:
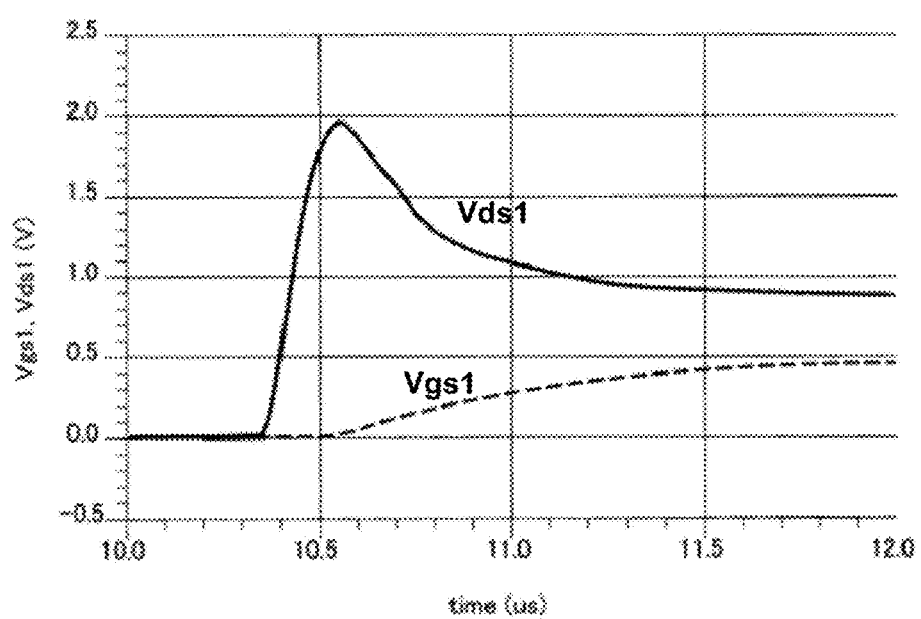
FIG. 11D is a voltage waveform diagram of a voltage between a gate and a source Vgs1 and a voltage between a drain and a source Vds1 of FET1A in case of the bias generation circuit that include a soft start circuit with a resistor and a capacitor.

Second, the resistor R2 and the capacitor C4 which are connected to the gate of PMOS1 inside the soft start circuit 6 are described using a simulation result. FIG. 11A is a voltage waveform diagram of Vgs2 (broken line) and Vds2 (solid line) of FET2A in case of the soft start circuit 6 without the resistor R2 and the capacitor C4. FIG. 11B is a voltage waveform diagram of Vgs1 (broken line) and Vds1 (solid line) of FET1A in case of the soft start circuit 6 without the resistor R2 and the capacitor C4. On the other hand, FIG. 11C is a voltage waveform diagram of a voltage Vgs2 (broken line) and Vds2 (solid line) of FET2A in case of the soft start circuit 6 with the resistor R2 and the capacitor C4. FIG. 11D is a voltage waveform diagram of Vgs1 (broken line) and Vds1 (solid line) of FET1A in case of the soft start circuit 6 with the resistor R2 and the capacitor C4. In FIG. 11C and FIG. 11D, the resistor R2 is set to be 115 kΩ (kilo-ohms), and the capacitor C4 is set to be 1.5 pF (picofarads).

FIG. 11A through FIG. 11D assume a FET model which does not break down is used. The power supply voltage Vdd is set to be 3.5 V. As shown in FIG. 11C and FIG. 11D, peak voltages of Vds1 and Vds2 may rise above 2 V, for example, 2.32 V when the resistor R2 and the capacitor C4 are not included. On the other hand, the peak voltage is 2 V or less when the resistor R2 and the capacitor C4 are included.

To reduce the noise figure NF, the micro-fabrication FET1A and FET2A, each with the gate length 0.14 μm, are used, and therefore, a drain breakdown voltage is lowered to about 2 V. However, as described above, the resistor R2 and the capacitor C4 can be provided in the soft start circuit 6 so that Vds does not exceed 2 V in the transient response period just after changing to the enable state.

In the embodiment, the micro-fabrication FET1A and FET2A provided on the SOI substrate are cascode-connected to compose the high frequency LNA1, and FET1A is operated in a voltage range of Vth<VB1<Vgs2 to make Gm/Ids of FET1A as large as possible. Also, the drain voltages of FET1A and FET1B are set to be a fixed voltage larger than the gate voltage of FET1A to obtain the high frequency LNA1 with an excellent noise figure NF. And the high frequency switch and the high frequency LNA1 can be formed on the common SOI substrate to be integrated into one chip.

Furthermore, the resistor R2 and the capacitor C4 are provided in the soft start circuit 6 to suppress the peak voltage of the source-drain voltage Vds1 and Vds2. And the peak voltage of the source-drain voltage Vds1 and Vds2 can be suppressed to be equal to or less than the drain withstand voltage when the micro-fabrication FET1A and FET2A are used.

A Second Embodiment

In a second embodiment, the body of FET2A is connected to the source thereof.

Figure 12:
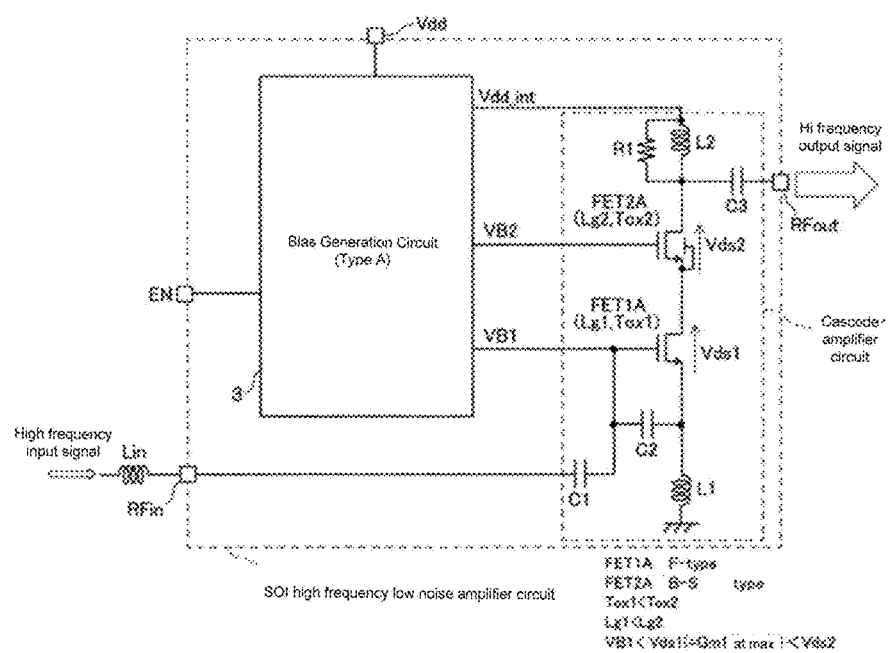
FIG. 12 is a block diagram of a high frequency LNA according to a second embodiment.

FIG. 12 is a block diagram of the high frequency LNA1 according to the second embodiment. The high frequency LNA1 in FIG. 12 is different from that of FIG. 1 in four respects as below.

1) The body of FET2A is connected to the source thereof.
2) A gate oxide film thickness Tox2 of FET2A is larger than a gate oxide film thickness Tox1 of FET1A.
3) A gate length Lg2 of FET2A is longer than a gate length Lg1 of FET1A.
4) The drain-source voltage Vds2 of FET2A is larger than drain-source voltage Vds1 of FET1A.

The high frequency LNA1 in FIG. 12 is similar to that of FIG. 1 in the fact that Vds1 of FET1A is larger than the gate voltage VB1 of FET1A.

As described in 4, the high frequency LNA1 in FIG. 12 is set to be Vds2>Vds1 to improve the linearity over that of the high frequency LNA1 in FIG. 11. Also, the increase of Vds2 does not lead to breakdown of FET2A due to the features described in 1) to 3).

The noise figure NF of gate-grounded FET2A is larger than that of FET1A. However, a deterioration of the noise figure NF of the high frequency LNA1 of FIG. 12 can be slight compared to that of FIG. 1, because the noise figure NF of the high frequency LNA1 is largely determined by a noise figure of a first stage. Thus, the linearity of the high frequency LNA1 according to the second embodiment can be improved by allowing the slight deterioration of the noise figure NF.

Figure 13:
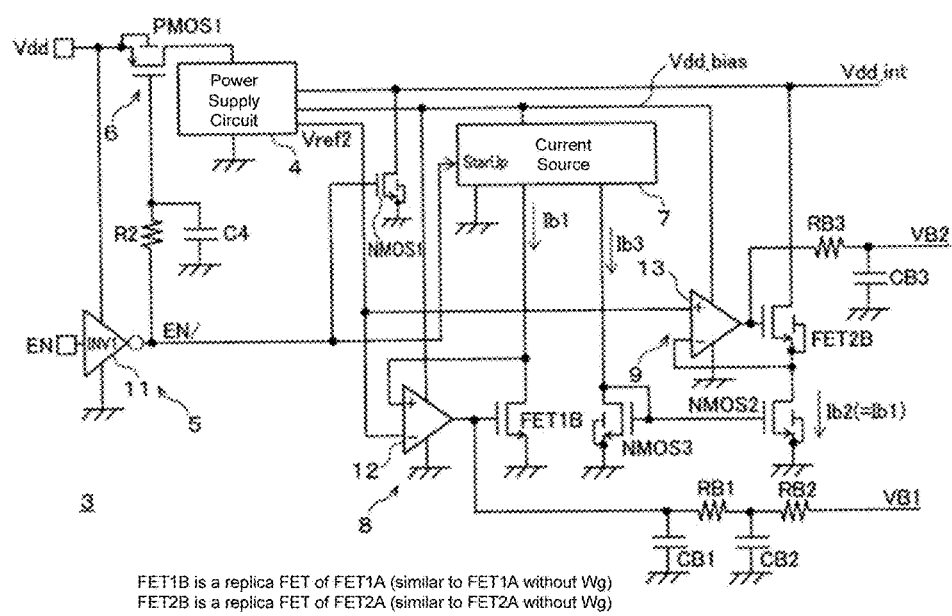
FIG. 13 is a circuit diagram showing an example of an internal configuration of the bias generation circuit in FIG. 12.

FIG. 13 is a circuit diagram showing an example of an internal configuration of the bias generation circuit in FIG. 12. The bias generation circuit 3 is different from that in FIG. 2 in two respects as below.

5) A body of FET2B is connected to its source.
6) The power supply circuit 4 generates the power supply voltage Vdd_bias for the current source 7 and the reference voltage Vref2 in addition to the internal voltage Vdd_int. The reference voltage Vref2 is smaller than Vdd_int/2 and is used for the first differential amplifier circuit 12 and the second differential amplifier circuit 13.

The power supply circuit 4 increases the internal voltage Vdd_int when the external power supply voltage Vdd is set to be high. In more detail, for example, Vdd_int=Vdd is set in case of Vdd 2.8 V and Vdd_int=2.8 V is set in case of Vdd>2.8 V.

Using the internal voltage Vdd_int, which is generated in the power supply circuit 4, as a power supply voltage for the current source 7 causes Vdd dependency of the currents Ib1 and Ib2. Therefore, the voltage Vdd_bias which is generated in the power supply circuit 4 is used as the power supply voltage for the current source 7. The voltage Vdd_bias is controlled to be about 1.8 V. to eliminate the Vdd dependency of the current Ib1.

Figure 14:
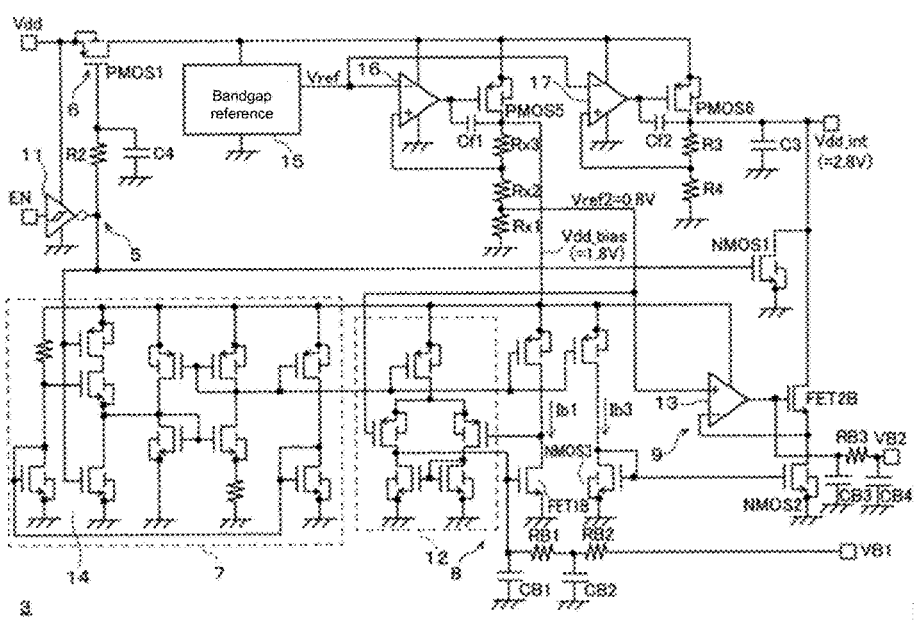
FIG. 14 is a circuit diagram showing a specific example of the bias generation circuit in FIG. 13.

FIG. 14 is a circuit diagram showing a specific example of the bias generation circuit 3 in FIG. 13. The bias generation circuit 3 in FIG. 14 includes a fourth differential amplifier circuit 17, a capacitor Cf2, a p-type transistor PMOS6, and resistors R3 and R4 in addition to the configuration in FIG. 10.

As with FIG. 10, a voltage which the drain voltage of PMOS5 is divided by the resistors Rx1, Rx2, and Rx3 is negatively fed back by the third differential amplifier circuit 16. The drain voltage of PMOS5 is referred to as Vdd_bias and used as the power supply voltage for the current source 7, the first differential amplifier circuit 12, and the second differential amplifier circuit 13. Also, a voltage in a connection node between the resistor Rx1 and the resistor Rx2 is used as the reference voltage Vref2 which is received in a negative input terminal of the first differential amplifier circuit 12 and a positive input terminal of the second differential amplifier circuit 13.

PMOS6 is cascode-connected to PMOS1. A resistor R3 and a resistor R4 are connected in series between the drain of PMOS6 and the ground node. A negative input terminal of the fourth differential amplifier circuit 17 receives the reference voltage Vref which is output from the band gap reference circuit 15 and the positive input terminal receives a voltage in a connection node between the resistor R3 and the resistor R4. The output signal of the fourth differential amplifier circuit 17 is received in the gate of PMOS6 and is output as the internal voltage Vdd_int through the capacitor Cf2 which is used as a stabilizing capacitor.

Figure 15:
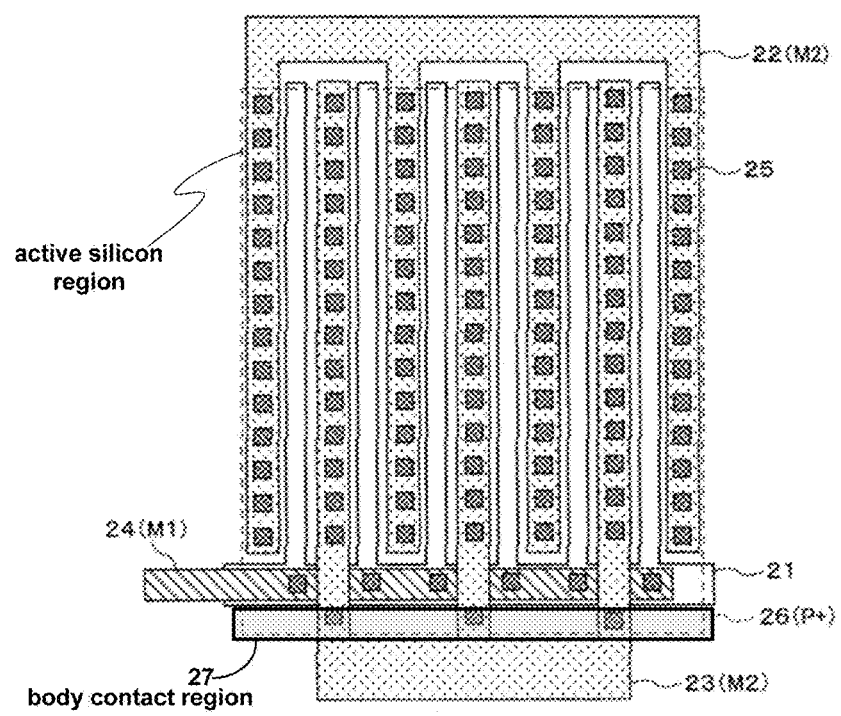
FIG. 15 is a layout diagram of FET2A according to the second embodiment.

FIG. 15 is a layout diagram of FET2A according to the second embodiment. FET2A in FIG. 15 includes a multi-finger type poly silicon gate 21. In FIG. 15, the number of the finger is set to be six. The number of the finger or the length of the finger can be arbitrarily set, for example, the number of the finger is set to be forty and the length of the finger is set to be 5 μm. The drain wiring 22 and the source wiring 23 are respectively arranged in a form of a comb according to an arrangement of the poly silicon gate 21.

The gate wiring 24 is arranged on the poly silicon gate 21 to be electrically connected to the poly silicon gate 21 through a plurality of contacts 25. Also, the drain wiring 22 is connected to a drain region which is below the drain wiring 22 through a plurality of contacts 25. The source wiring 23 is connected to a source region which is below the source wiring 23 through a plurality of contacts 25. The active silicon region 26 which is arranged below the drain region, the channel region, and the source region is shown by a broken line in FIG. 15. A body contact region 27 (shaded) is used to connect to the active silicon region 26 and the active silicon region 26 is in turn connected to the source wiring 23 through the contacts 25 so that FET2A becomes B-S connection-type.

Figure 16:
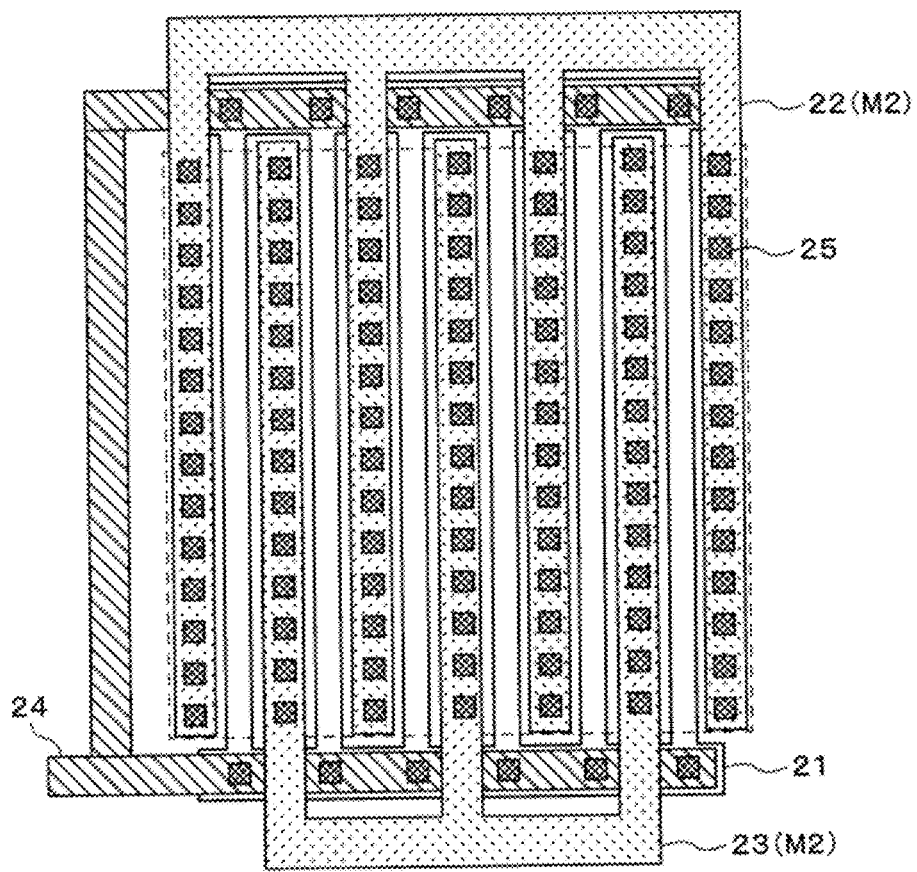
FIG. 16 is a layout diagram of FET1A according to the second embodiment.

FIG. 16 is a layout diagram of FET1A according to the second embodiment. As with FIG. 15, FET1A in FIG. 16 includes the multi-finger type poly silicon gate 21. The poly silicon gate 21 is formed in a H shape to support each of the fingers in both ends in the longitudinal direction of the fingers. Thereby, the gate resistance and the noise figure NF can be decreased. The body of FET1A in FIG. 16 is different from that of FET2A in FIG. 15 in a respect which a body is in a floating state.

The layout of FET1A in FIG. 16 can be applicable to FET1A and FET2A.

Thus, the body of FET2A is connected to the source to increase the parasitic capacitance of the body of FET2A, thereby the gain bandwidth product ft is lowered and the noise figure is increased. On the other hand, the drain breakdown voltage is increased. Also, the gate oxide film thickness Tox2 of FET2A is larger than the gate oxide film thickness Tox1 of FET1A, thereby the gate withstand voltage becomes high, and the gate length Lg2 of FET2A is longer than the gate length Lg1 of FET1A, thereby, the drain breakdown voltage becomes high. For example, the maximum Vdd_int value in which Vds and Vgs are both allowable is about 1.6 V when F-type of FET2A is set to be Lg=0.14 μm and Tox=2.5 nm. The maximum Vdd_int value is about 3 V when B—S type of FET2A is set to be Lg=0.25 μm and Tox=6 nm. Thereby, a voltage amplitude of the high frequency LNA1 can be larger.

A Third Embodiment

An internal configuration of the bias generation circuit 3 according to a third embodiment is simpler than that of FIG. 12.

Figure 17:
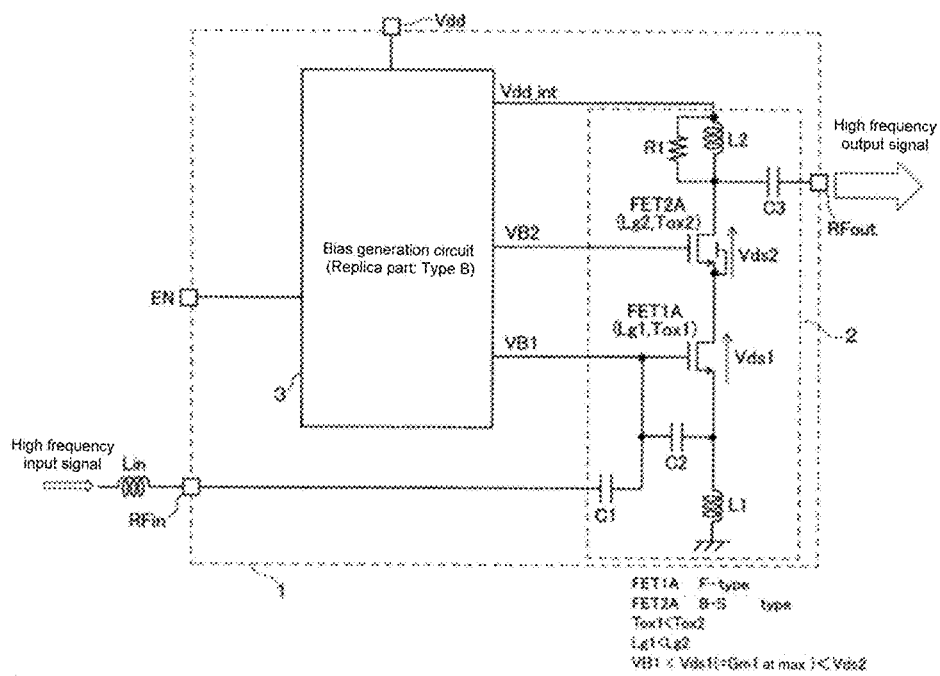
FIG. 17 is a block diagram of a high frequency LNA1 according to a third embodiment.

FIG. 17 is a block diagram of the high frequency LNA1 according to the third embodiment. The high frequency LNA1 in FIG. 17 is similar to that in FIG. 12 apart from the internal configuration of the bias generation circuit 3.

Figure 18:
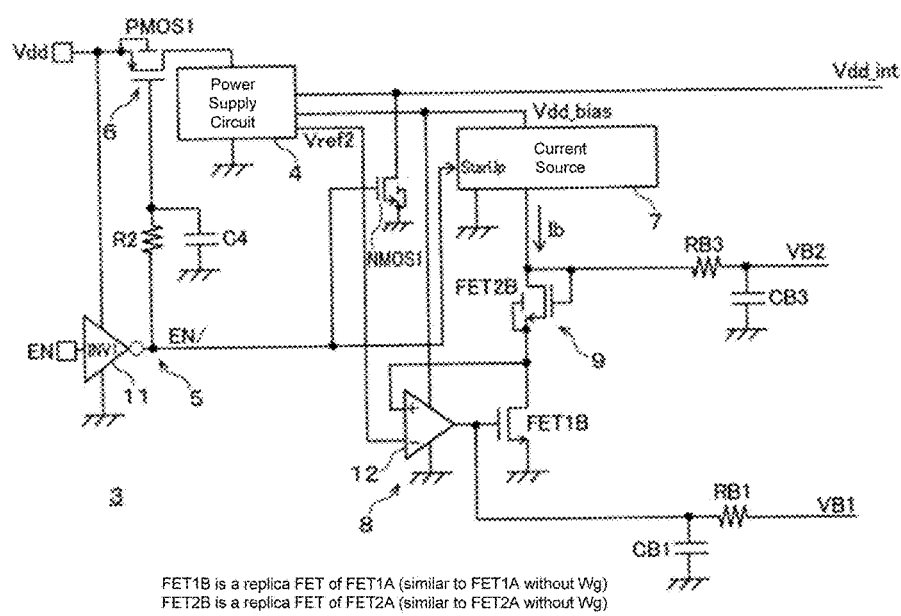
FIG. 18 is a circuit diagram showing an example of an internal configuration of the bias generation circuit in FIG. 17.

FIG. 18 is a circuit diagram showing an example of an internal configuration of the bias generation circuit 3 in FIG. 17. A second replica circuit 9 inside the bias generation circuit 3 in FIG. 18 includes FET2B, a resistor RB3, and a capacitor CB3, while the second differential amplifier circuit 13, NMOS2, and NMOS3 as shown in FIG. 13 are not included.

The source of FET2B is connected to the drain of FET1B. The drain of FET2B is supplied with the current Ib from the current source 7. The current Ib flows between the drain of FET2B and the source thereof, thereafter, between the drain of FET1B and the source thereof.

A ratio of the gate width of FET1A the gate width of FET1B is set to be equal to the ratio of the gate width of FET2A and the gate width of FET2B.

Figure 19:
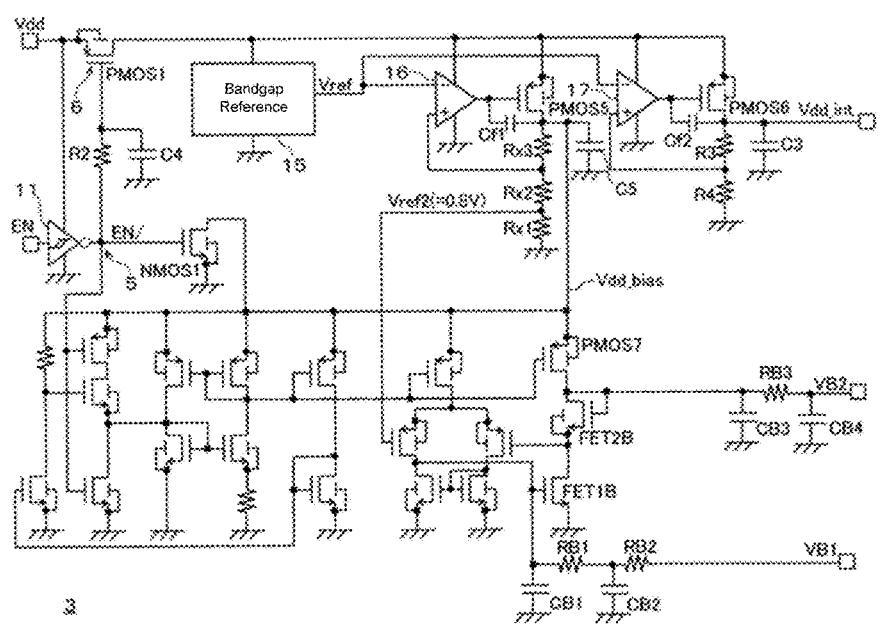
FIG. 19 is a circuit diagram showing a specific example of the bias generation circuit in FIG. 18.

FIG. 19 is a circuit diagram showing a specific example of the bias generation circuit 3 in FIG. 18. The bias generation circuit 3 in FIG. 19 includes a p-type transistor PMOS7 which is cascode-connected between the drain of PMOS5 and the ground node, FET2B, and FET1B. The current Ib in response to the drain voltage Vdd_bias flows between the drain of PMOS7 and the source thereof, between the drain of FET2B and the source thereof, and between the drain of FET1B and the source thereof.

In FIG. 18 and FIG. 19, FET1B and FET1A in which the sources are grounded, have the same element constant apart from the gate width. The gate of FET1B is connected to the gate of FET1A to form the current mirror circuit. The ratio of the gate width of FET1A to the gate width of FET1A is set to be 1:K (for example, K=100). Also, the gate of FET1B receives the output signal from the first differential amplifier circuit 12.

The positive input terminal in the first differential amplifier circuit 12 is connected to the drain of FET1B, and the negative input terminal receives the reference voltage Vref2 output from the power supply circuit 4. Hereinafter, Vref2=0.8 V is set. The first differential amplifier circuit 12 and FET1B configure the negative feedback circuit so that the drain-source voltage of FET1B is set to be 0.8 V.

FET2B is diode-connected and the source thereof is connected to the drain of FET1B. The drain voltage and the gate voltage of FET2B are set to be VB2.

FET2B and FET2A have the same element constant apart from the gate width. The ratio of the gate width of FET2B to the gate width of FET2A is set to be 1:K. The drain of FET2B is supplied with the current Ib from the current source 7. The gate length of FET2B and FET2A are both longer than the gate length of FET1A to have good saturation characteristics in FET2B and FET2A, that is, Gd is lowered.

Figure 20:
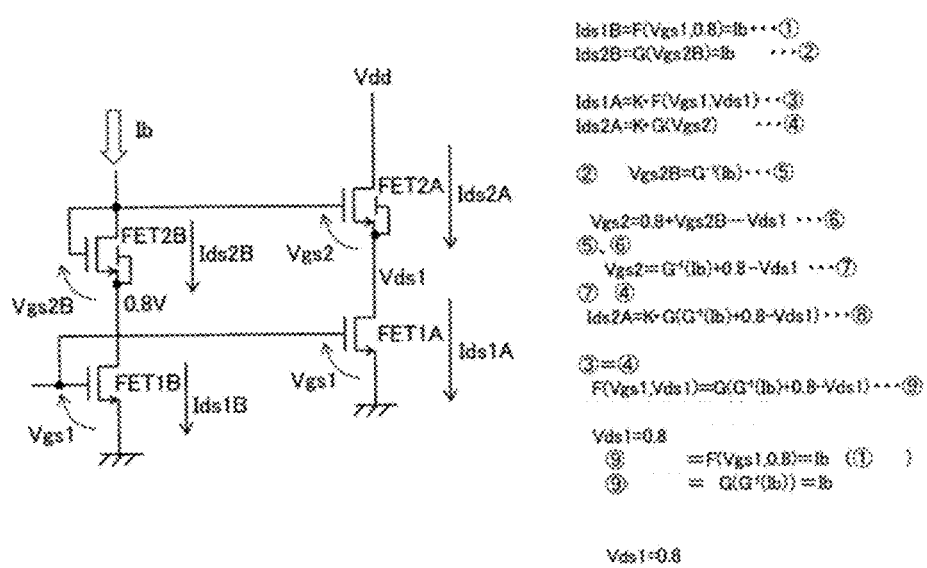
FIG. 20 is a circuit diagram showing a major part of the bias generation circuit in FIG. 18 and FIG. 19.

FIG. 20 is a circuit diagram showing a major part of the bias generation circuit 3 in FIG. 18 and FIG. 19. In FIG. 20, the drain currents of FET1B, FET2B, FET1A, and FET2A are respectively referred to as Ids1B, Ids2B, Ids1A, and Ids2A. The drain current Ids1B is expressed as a function F of the gate-source voltage and the drain-source voltage by an expression (8) as described below.

$$Ids1B = F(Vgs1, 0.8) = Ib \quad (8)$$

Ids2B is expressed as a function G of only the gate-source voltage by an expression (9) as described below when Gd=0 is assumed.

$$Ids2B = G(Vgs2B) = Ib \quad (9)$$

Herein, arguments of the function F and the function G are represented in parentheses.

Similarly, Ids1A and Ids2A are respectively expressed by an expression (10) and (11) as below.

$$Ids1A = K \cdot F(Vgs1, Vds1) \quad (10)$$

$$Ids2A = K \cdot G(Vgs2) \quad (11)$$

An expression (12) is obtained by rearranging the expression (9).

$$Vgs2B = G^{-1}(Ib) \quad (12)$$

Where $G^{-1}$ represents an inverse function of the function G.

Also, expression (13) is established as below.

$$Vgs2 = 0.8 + Vgs2B - Vds1 \quad (13)$$

Expression (14) is obtained by substituting the expression (12) into the expression (13).

$$Vgs2 = G^{-1}(Ib) + 0.8 - Vds1 \quad (14)$$

Expression (15) is obtained by substituting the expression (14) into the expression (11).

$$Ids2A = K \cdot G(G^{-1}(Ib) + 0.8 - Vds1) \quad (15)$$

Expression (16) is established when Ids1A=Ids2A is set.

$$K \cdot F(Vgs1, Vds1) = K \cdot G(G^{-1}(Ib) + 0.8 - Vds1) \quad (16)$$

Where Ib represents a constant which is given for a design, and Vgs1 is uniquely determined by using the function F and Ib as described in the expression (8).

Therefore, the expression (16) is an equation in which Vds1 is used as a variable.

If it is assumed that a solution to the equation (16) is Vds1=0.8, a left side of the expression (16)=F(Vgs1, 0.8) is established, and furthermore, the left side of the expression (16)=Ib is established by substituting the expression (8).

Also, a right side of the expression (10)=G ($G^{-1}$ (Ib))=Ib is established.

Accordingly, the above assumption is correct, that is, Vds1=0.8 can be established.

The gate-source voltage and the drain-source voltage of FET1B and FET1A are equal to each other, thereby, an expression (17) is established.

$$Ids1A = K \cdot Ib \quad (17)$$

As described in the expression (17), the drain-source current of FET1A and FET2A which are cascode-connected to each other depends on only Ib and K without depending on Vdd.

The internal configuration in the second replica circuit 9 in the third embodiment is simpler than that in the second embodiment to reduce a circuit scale of the bias generation circuit 3.

A Fourth Embodiment

A second replica circuit 9 in the bias generation circuit 3 according to a fourth embodiment is similar to the replica circuit 9 according to the first embodiment which is simplified in the same way as that of the third embodiment.

Figure 21:
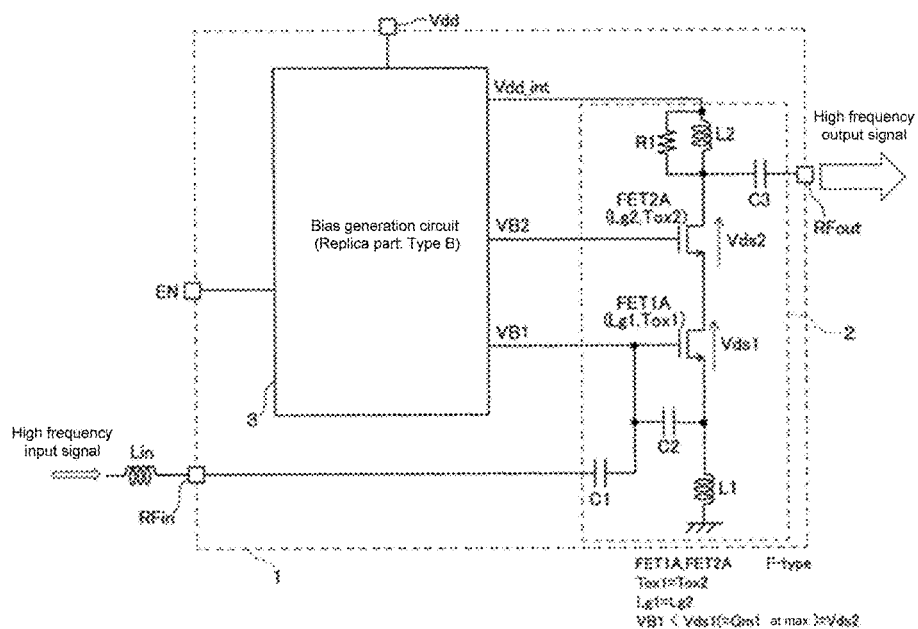
FIG. 21 is a block diagram of a high frequency semiconductor amplifier circuit 1 according to a fourth embodiment.

FIG. 21 is a block diagram of a high frequency semiconductor amplifier circuit 1 according to the fourth embodiment. The high frequency semiconductor amplifier circuit 1 in FIG. 21 is similar to that in FIG. 1 apart from the internal configuration of the bias generation circuit 3.

Figure 22:
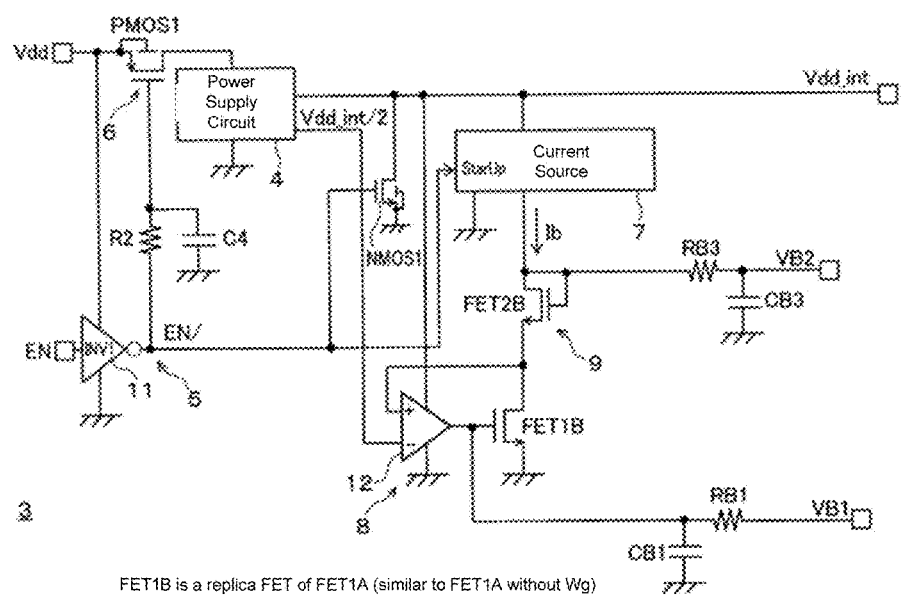
FIG. 22 is a circuit diagram showing an example of an internal configuration of the bias generation circuit 3 according to the fourth embodiment.

FIG. 22 is a circuit diagram showing an example of an internal configuration of the bias generation circuit 3 according to the fourth embodiment. The internal configurations of the second replica circuit 9 differ between the bias generation circuit 3 in FIG. 22 and that in FIG. 9. The second replica circuit 9 in FIG. 22 includes FET2B, the resistor RB3, and the capacitor CB3 just like that in FIG. 18, while the second differential amplifier circuit 13, NMOS2, and NMOS3 as shown in FIG. 9 are not included. The operation of second replica circuit 9 in FIG. 22 is the same as that in FIG. 18.

Vds1 of FET1A is equal to Vds2 of FET2A and Vdd_int=1.6 V is set. The power supply voltage for the current source 7 is set to be Vdd_int.

Figure 23:
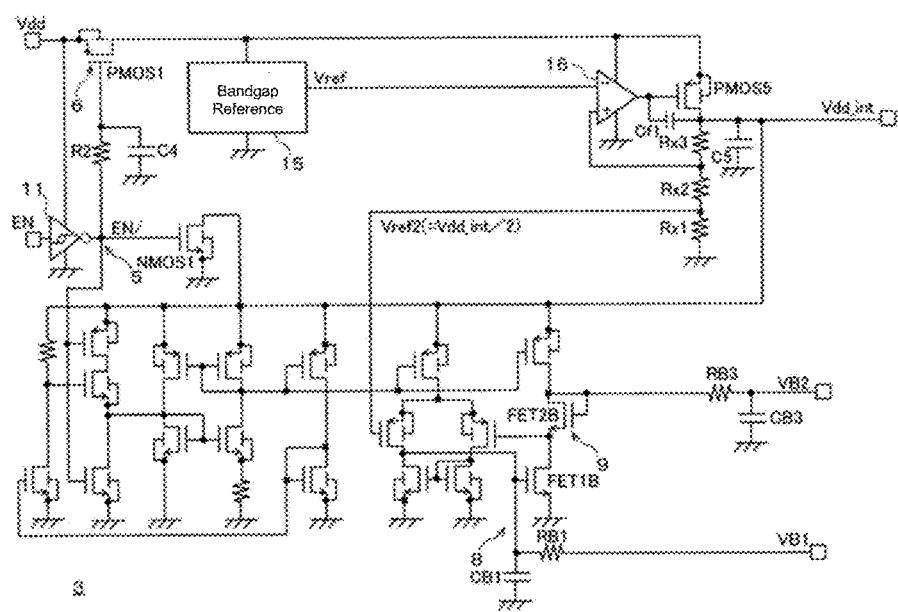
FIG. 23 is a circuit diagram showing a specific example of the bias generation circuit 3 in FIG. 22.

FIG. 23 is a circuit diagram showing a specific example of the bias generation circuit 3 in FIG. 22. The bias generation circuit 3 in FIG. 23 uses Vdd_int as a power supply voltage for the current source 7 as described above and therefore, do not includes a circuit part for generating Vdd_bias in the bias generation circuit 3 as shown in FIG. 20 to be simplified more than the bias generation circuit 3 in FIG. 20.

The circuit scale of the bias generation circuit 3 in the fourth embodiment can be reduced more than that in the first embodiment.

Figure 24:
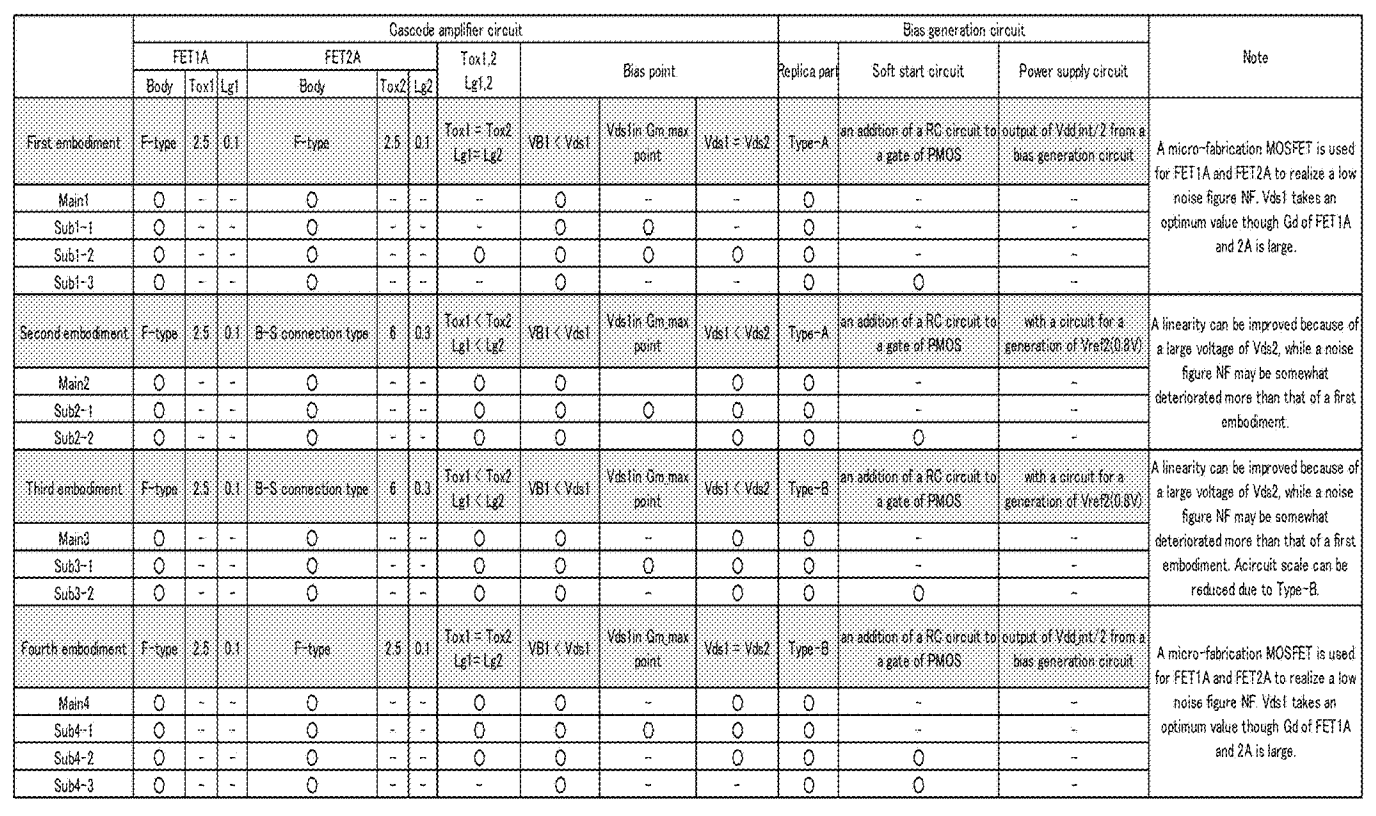

FIG. 24 is a diagram summarizing data from the first to the fourth embodiments. The second replica circuit 9 according to the first and the second embodiments is referred to as Type-A and the simplified second replica circuit 9 according to the third and the fourth embodiments is referred to as Type-B. A symbol, "-" represents that it is arbitrary (don't care).

The gate voltage VB1 of FET1A is smaller than the drain-source voltage Vds1 of FET1A in all from the first to the fourth embodiments, that is, FET1A is operated in a voltage range of Vth<VB1<Vgs2 to make Gm/Ids of FET1A as large as possible.

In the first and the fourth embodiments, both FET1A and FET2A include the F-type MOS transistor. In the second and the third embodiment, FET1A includes the F-type MOS transistor and FET2A includes the B-S connection-type MOS transistor.

In the first and the second embodiments, the second replica circuit 9 is not simplified, that is, Type-A. In the third and the fourth embodiments, the second replica circuit 9 is simplified, that is, Type-B.

As shown in FIG. 24, a main modified example in the first embodiment is referred to as Main1, and the other modified examples are referred to as sub1-1, sub1-2, and sub-3. The gate oxide film thickness and the gate length of FET1A and FET2A in Main1 are set arbitrarily, and the voltage Vds1 between the drain and the source of FET1A is also set arbitrarily. An addition of the resistor R2 and the capacitor C4 to the soft start circuit 6 is optional, and also, an output of the voltage of Vdd_int/2 from the power supply circuit 4 is optional. The other modified example sub1-1 is similar to an example that the Vds1 in the main modified example Main1 is set so as to take a maximum value of Gm. The other modified example sub1-2 is similar to an example that additional conditions of Tox1=Tox2 and Lg1=Lg2, and an additional condition of Vds1=Vds2 are set in the other modified example sub1-1. The other modified example sub1-3 is similar to an example that the soft start circuit 6 in the main modified example Main1 further includes the resistor R2 and the capacitor C4.

In all of the modified examples in the first embodiment, FET1A and FET2A have a microstructure in order to have a good noise figure NF, and the drain-source voltage Vds1 of FET1A can be optimized while the drain conductance Gd of FET1A and FET2A are large.

As shown in FIG. 24, a main modified example in the second embodiment is referred to as Main2, and the other modified examples are referred to as sub2-1 and sub2-2. The gate oxide film thickness and the gate length of FET1A and FET2A in Main2 are set arbitrarily, and conditions of Tox1<Tox2 and Lg1<Lg2 are set. Also, the voltage Vds1 between the drain and the source of FET1A is set arbitrarily, and a condition of Vds1<Vds2 is set. An addition of the resistor R2 and the capacitor C4 to the soft start circuit 6 is optional, and an output of the reference voltage Vref2 (=0.8 V) from the power supply circuit 4 is also optional. The other modified example sub2-1 is similar to an example that the Vds1 in the main modified example Main2 is set so as to take a maximum value of Gm. The other modified example sub2-2 is similar to an example that the soft start circuit 6 in the main modified example Main2 further includes the resistor R2 and the capacitor C4.

In all of the modified examples in the second embodiment, the linearity can be improved because of the large voltage of Vds2, while the noise figure NF in the second embodiment is somewhat less than that of the first embodiment.

As shown in FIG. 24, a main modified example in the third embodiment is referred to as Main3, and the other modified examples are referred to as sub3-1 and sub3-2. The gate oxide film thickness and the gate length of FET1A and FET2A in Main3 are set arbitrarily, and conditions of Tox1<Tox2 and Lg1<Lg2 are set. Also, the voltage Vds1 between the drain and the source of FET1A is set arbitrarily, and a condition of Vds1<Vds2 is set. An addition of the resistor R2 and the capacitor C4 to the soft start circuit 6 is optional, and an output of the reference voltage Vref2 (=0.8 V) from the power supply circuit 4 is also optional. The other modified example sub3-1 is similar to an example that the Vds1 in the main modified example Main3 is set so as to take a maximum value of Gm. The other modified example sub3-2 is similar to an example that the soft start circuit 6 in the main modified example Main3 further includes the resistor R2 and the capacitor C4.

In all of the modified examples in the third embodiment, the linearity can be improved because of the large voltage of Vds2, while the noise figure NF in the third embodiment is somewhat deteriorated more than that of the first embodiment.

As shown in FIG. 24, a main modified example in the fourth embodiment is referred to as Main4, and the other modified examples are referred to as sub4-1, sub4-2, and sub4-3. The gate oxide film thickness and the gate length of FET1A and FET2A in Main4 are set arbitrarily, and conditions of Tox1=Tox2 and Lg1=Lg2 are set. Also, the voltage Vds1 between the drain and the source of FET1A is set arbitrarily. An addition of the resistor R2 and the capacitor C4 to the soft start circuit 6 is optional, and an output of the voltage Vdd_int/2 from the power supply circuit 4 is also optional. The other modified example sub4-1 is similar to an example that the Vds1 in the main modified example Main4 is set so as to take a maximum value of Gm. The other modified example sub4-2 is similar to an example that the soft start circuit 6 in the main modified example Main4 further includes the resistor R2 and the capacitor C4. The other modified example sub4-3 is similar to an example that size relations of the gate oxide film thickness and the gate length between FET1A and FET2A in Main4 are set arbitrarily and a size relation between Vds1 and Vds2 in Main4 is optional and the soft start circuit 6 further includes the resistor R2 and the capacitor C4.

In all of the modified examples in the fourth embodiment, FET1A and FET2A has a microstructure to have a good noise figure NF, and the drain-source voltage Vds1 of FET1A can be optimized while the drain conductance Gd of FET1A and FET2A are large. And a circuit scale can be reduced by simplifying the second replica circuit 9.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A high frequency semiconductor amplifier circuit, comprising:
   a first transistor provided on a Silicon on Insulator (SOI) substrate and having a source which is connected to a signal ground by a source degeneration inductor;
   a second transistor provided on the SOI substrate and cascode-connected to the first transistor; and
   a bias generation circuit provided on the SOI substrate and generating a gate voltage for the first transistor, a gate voltage for the second transistor, and a first voltage for a drain of the second transistor,
   wherein the bias generation circuit is configured to set the gate voltage of the first transistor to a voltage between a second voltage and a third voltage, and wherein the gate voltage is smaller than a voltage between a drain and a source of the first transistor, the second voltage is a threshold voltage of the first transistor and the third voltage is a gate-source voltage at which a second derivative of a square root of the drain current with respect to the gate-to-source voltage becomes a maximum.

2. The high frequency semiconductor amplifier circuit according to claim 1, wherein the voltage between the drain and the source of the first transistor is set to be smaller than a voltage at which holes are accumulated in a body region of the first transistor due to an impact ionization.

3. The high frequency semiconductor amplifier circuit according to claim 1, wherein the body region of the first transistor and a body region of the second transistor are in a floating state.

4. The high frequency semiconductor amplifier circuit according to claim 1, wherein the body region of the first transistor is in a floating state and a body region of the second transistor are connected to a source thereof.

5. The high frequency semiconductor amplifier circuit according to claim 1, wherein the bias generation circuit controls the gate voltage of the first transistor and the gate voltage of the second transistor so that the voltage between the drain and the source of the first transistor and the voltage between the drain and the source of the second transistor are equal.

6. The high frequency semiconductor amplifier circuit according to claim 1, wherein
the bias generation circuit is configured to generate the gate voltages of the first and the second transistors so as to set the voltage between the drain and the source of the first transistor such that a transconductance of the first transistor takes a maximum value at a predetermined a drain current of the first transistor.

7. A high frequency semiconductor amplifier circuit, comprising:
a first transistor provided on a Silicon on Insulator (SOI) substrate and having a source which is connected to a signal ground by a source degeneration inductor;
a second transistor provided on the SOI substrate and cascode-connected to the first transistor; and
a bias generation circuit provided on the SOI substrate and generating a gate voltage for the first transistor, a gate voltage for the second transistor, and a first voltage for a drain of the second transistor,
wherein the bias generation circuit includes a third transistor which forms a current mirror circuit with the first transistor, a fourth transistor which forms a current mirror circuit with the second transistor, a power supply circuit configured to generate the first voltage and a second voltage which is a fixed voltage larger than the gate voltage of the first transistor, and a first differential amplifier circuit configured to perform a negative feedback control so that a drain voltage of the third transistor coincides with the second voltage, and a current between the drain and the source of the third transistor and a current between the drain and the source of the fourth transistor are equal.

8. The high frequency semiconductor amplifier circuit according to claim 7, further comprising:
a second differential amplifier circuit configured to perform a negative feedback control so that a source voltage of the fourth transistor coincides with the second voltage.

9. The high frequency semiconductor amplifier circuit according to claim 7, wherein a body region of the third transistor and a body region of the fourth transistor are in a floating state.

10. The high frequency semiconductor amplifier circuit according to claim 7, wherein a body region of the third transistor is in a floating state and a body region of the fourth transistor are connected to a source thereof.

11. The high frequency semiconductor amplifier circuit according to claim 7, wherein gate lengths of the first and the third transistors are smaller than gate lengths of the second and the fourth transistors, and thicknesses of gate insulating films of the first and the third transistors are smaller than thicknesses of gate insulating films of the second and the fourth transistors.

12. The high frequency semiconductor amplifier circuit according to claim 7, further comprising:
a fifth transistor that connects an input power supply voltage to the power supply circuit when in an on-state; and
a soft start circuit configured to adjust a transition time from the on-state to an off state in the fifth transistor.

13. A bias circuit for an amplifier circuit that includes a first transistor provided on a Silicon on Insulator (SOI) substrate and having a gate, source and drain, a second transistor provided on the SOI substrate having a gate, source and drain, the second transistor cascode-connected to the first transistor, the bias circuit comprising:
a first replica circuit that includes a third transistor configured as a current mirror to the first transistor, wherein the first replica circuit determines a gate-to-source voltage of the third transistor by setting the drain-to-source voltage of the third transistor to a first fraction of a power supply voltage and the drain current of the third transistor to a fixed current, and wherein the first replica circuit provides the gate-to-source of the third transistor to the gate of first transistor, causing the drain-to-source voltage of the first transistor to be equal to the drain-to-source voltage of the third transistor and the drain current of the first transistor to be a multiple of the fixed current; and
a second replica circuit that includes a fourth transistor configured as a current mirror to the second transistor, wherein the second replica circuit determines a gate-to-source voltage of the fourth transistor by setting a drain-to-source voltage of the fourth transistor to a second fraction of the power supply voltage and the drain current of the fourth transistor to the fixed current, and wherein the second replica circuit provides the gate-to-source voltage of the fourth transistor to the gate of the second transistor, causing the drain-to-source voltage of the second transistor to be equal to the drain-to-source voltage of the fourth transistor.

14. The bias circuit according to claim 13, wherein the drain-to-source voltage of the first transistor is set at a point at which the first transistor has maximum transconductance at the drain current in the first transistor.

15. The bias circuit according to claim 13, wherein the gate-to-source of the first transistor is less than the drain-to-source voltage of the first transistor and larger than a threshold voltage of the first transistor.

16. The bias circuit according to claim 13, wherein the first and second transistors are floating-body type transistors.

17. The bias circuit according to claim 16, wherein the first fraction and second fraction of the power supply voltage are equal to one-half.

18. The bias circuit according to claim 13, wherein the first transistor is a floating-body type transistor and the second transistor is a body-connected-to-source type transistor.

19. The bias circuit according to claim 18, wherein first fraction is less than one-half and the second fraction is greater than one-half.

20. The bias circuit according to claim 18, wherein the drain-to-source voltage of the first transistor is less than the drain-to-source voltage of the second transistor.

* * * * *